United States Patent
Park

(10) Patent No.: US 9,831,454 B2
(45) Date of Patent: Nov. 28, 2017

(54) ORGANIC LIGHT EMITTING DISPLAY DEVICE AND LIGHTING APPARATUS FOR VEHICLES USING THE SAME

(71) Applicant: LG Display Co., Ltd., Seoul (KR)

(72) Inventor: EunJung Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/188,377

(22) Filed: Jun. 21, 2016

(65) Prior Publication Data

US 2017/0069865 A1 Mar. 9, 2017

(30) Foreign Application Priority Data

Sep. 9, 2015 (KR) .......................... 10-2015-0127872

(51) Int. Cl.
*H01L 51/00* (2006.01)
*H01L 51/52* (2006.01)
(Continued)

(52) U.S. Cl.
CPC ...... *H01L 51/5004* (2013.01); *F21S 48/1163* (2013.01); *F21S 48/217* (2013.01); *F21S 48/31* (2013.01); *H01L 27/3209* (2013.01); *H01L 51/5072* (2013.01); *H01L 51/5092* (2013.01); *H01L 51/5206* (2013.01); *H01L 51/5221* (2013.01); *H01L 51/5278* (2013.01); *H01L 2251/301* (2013.01); *H01L 2251/552* (2013.01); *H01L 2251/556* (2013.01)

(58) Field of Classification Search
CPC ............. H01L 51/5004; H01L 51/5072; H01L 51/5092; H01L 51/5206; H01L 51/5221; H01L 51/5278; H01L 27/3209; F21S 48/1163; F21S 48/217; F21S 48/31
See application file for complete search history.

(56) References Cited

U.S. PATENT DOCUMENTS 8,803,137 B2 * 8/2014 Lee .................. H01L 51/52
257/102
2006/0289882 A1 12/2006 Nishimura et al.
(Continued)

FOREIGN PATENT DOCUMENTS

| CN | 1744786 A | 3/2006 |
|---|---|---|
| CN | 101997021 A | 3/2011 |

OTHER PUBLICATIONS

Chinese Office Action dated Sep. 28, 2017, in counterpart Chinese Patent App. No. 201610463190.X Note: U.S. 2013/0306949 cited therein is already of record.

*Primary Examiner* — Ida M Soward
(74) *Attorney, Agent, or Firm* — Morgan, Lewis & Bockius LLP

(57) ABSTRACT

An organic light emitting display device and a light apparatus for vehicles using the same include a first layer on a first electrode, the first layer including a first emission layer and a first electron transport layer, a second layer on the first layer, the second layer including a second emission layer and a second electron transport layer, a second electrode on the second layer, and an N-type charge generation layer between the first layer and the second layer, wherein a low unoccupied molecular orbitals (LUMO) level of the first electron transport layer is higher than a LUMO level of a host included in the N-type charge generation layer.

19 Claims, 8 Drawing Sheets

(51) Int. Cl.
 *H01L 27/32* (2006.01)
 *H01L 51/50* (2006.01)
 *F21S 8/10* (2006.01)

(56) References Cited

U.S. PATENT DOCUMENTS

| | | | | |
|---|---|---|---|---|
| 2013/0264551 A1* | 10/2013 | Pieh | ................... | H01L 51/5056 257/40 |
| 2013/0306949 A1 | 11/2013 | Nowatari et al. | | |
| 2014/0117337 A1* | 5/2014 | Jung | ................... | H01L 51/5044 257/40 |
| 2015/0090984 A1* | 4/2015 | Kang | ................. | H01L 51/5278 257/40 |
| 2015/0144897 A1* | 5/2015 | Kang | ................. | H01L 51/5076 257/40 |
| 2015/0155513 A1* | 6/2015 | Pieh | ................... | H01L 27/3209 257/40 |
| 2015/0188066 A1* | 7/2015 | Song | ................... | H01L 51/002 257/40 |
| 2015/0188087 A1* | 7/2015 | Lee | ................. | H01L 51/5265 257/40 |
| 2015/0311466 A1* | 10/2015 | Jaeger | ................ | H01L 51/0078 257/40 |
| 2016/0043327 A1* | 2/2016 | Yoo | ....................... | H01L 51/504 257/40 |
| 2016/0104844 A1* | 4/2016 | Kang | ................ | H01L 51/0067 257/40 |
| 2016/0141502 A1* | 5/2016 | Joo | .................... | H01L 51/0052 257/40 |
| 2016/0322568 A1* | 11/2016 | Fadhel | ............... | H01L 51/5076 |
| 2016/0343942 A1* | 11/2016 | Hamada | .............. | H01L 51/5016 |
| 2017/0062754 A1* | 3/2017 | Ohnuma | ............. | H01L 51/0085 |
| 2017/0084876 A1* | 3/2017 | Suzuki | ............... | H01L 51/5278 |

* cited by examiner

ORGANIC LIGHT EMITTING DISPLAY DEVICE AND LIGHTING APPARATUS FOR VEHICLES USING THE SAME

CROSS-REFERENCE TO RELATED APPLICATIONS

This application claims the benefit of the Korean Patent Application No. 10-2015-0127872 filed on Sep. 9, 2015, which is hereby incorporated by reference as if fully set forth herein.

BACKGROUND

Field

The present disclosure relates to an organic light emitting display device and a lighting apparatus using the same, and more particularly, to an organic light emitting display device and a lighting apparatus for vehicles using the same with enhanced lifetime.

Discussion of the Related Art

Recently, as society advances to the information-oriented society, the field of display devices which visually express an electrical information signal is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention.

Moreover, organic light emitting devices (e.g., organic light emitting diodes (OLEDs)) applied to organic light lighting display devices are next-generation light sources having self-luminance characteristic, and are better in viewing angle, contrast, response time, and consumption power than liquid crystal. Also, the organic light emitting devices have a surface emission structure, and thus are easy to implement a flexible type.

Recently, research for using the organic light emitting devices as light sources of lighting or display devices is being actively done based on good characteristics of the organic light emitting devices.

SUMMARY

Accordingly, the present disclosure is directed to provide an organic light emitting display device and a lighting apparatus for vehicles using the same that substantially obviate one or more problems due to limitations and disadvantages of the related art.

An object of the present invention is to provide an organic light emitting display device and a lighting apparatus for vehicles using the same, which have lifetime enhanced by adjusting a LUMO level of each of an electron transport layer and a charge generation layer.

Another object of the present invention is to provide an organic light emitting display device and a lighting apparatus for vehicles using the same, which maintain enhanced lifetime at a room temperature or a high temperature by adjusting a LUMO level of each of an electron transport layer and a charge generation layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the disclosure, as embodied and broadly described herein, an organic light emitting display device comprises a first layer on a first electrode, the first layer including a first emission layer and a first electron transport layer, a second layer on the first layer, the second layer including a second emission layer and a second electron transport layer, a second electrode on the second layer, and an N-type charge generation layer between the first layer and the second layer, wherein a low unoccupied molecular orbitals (LUMO) level of the first electron transport layer is higher than a LUMO level of a host included in the N-type charge generation layer.

A difference between the LUMO level of the first electron transport layer and the LUMO level of the host included in the N-type charge generation layer may be greater than 0.2 eV.

A difference between the LUMO level of the first electron transport layer and the LUMO level of the host included in the N-type charge generation layer may be 0.4 eV or more.

A thickness of the first electron transport layer may be 5 nm to 30 nm, and the first electron transport layer may include one material or the first electron transport layer may be formed by co-depositing at least two materials.

The N-type charge generation layer may include at least one material among lithium (Li), sodium (Na), potassium (K), cesium (Cs), magnesium (Mg), strontium (Sr), barium (Ba), radium (Ra), Liq, and an N-type dopant, the host doped with the at least one material.

One among the first electrode and the second electrode may include a semitransmissive electrode.

The first emission layer and the second emission layer may emit lights having a same color.

In another aspect, an organic light emitting display device comprises a first layer on a first electrode, the first layer including a first emission layer and a first electron transport layer, a second layer on the first layer, the second layer including a second emission layer and a second electron transport layer, a second electrode on the second layer, and an N-type charge generation layer between the first layer and the second layer, the N-type charge generation layer including a metal, wherein the organic light emitting display device has an ALEN (adjusted low unoccupied molecular orbitals (LUMO) level between the electron transport layer (ETL) and the N-type charge generation layer (N-type CGL)) structure where a LUMO level of the first electron transport layer and a LUMO level of a host in the N-type charge generation layer are adjusted to prevent the metal in the N-type charge generation layer from being diffused to the first emission layer and maintain an emission zone in the first emission layer despite the elapse of time.

A difference between the LUMO level of the first electron transport layer and the LUMO level of the host included in the N-type charge generation layer may be greater than 0.2 eV.

A difference between the LUMO level of the first electron transport layer and the LUMO level of the host included in the N-type charge generation layer may be 0.4 eV or more.

The metal included in the N-type charge generation layer may be at least one material among lithium (Li), sodium (Na), potassium (K), cesium (Cs), magnesium (Mg), strontium (Sr), barium (Ba), radium (Ra), Liq, and an N-type dopant.

In another aspect, a lighting apparatus for a vehicle comprises an organic light emitting device including an emission layer, an electron transport layer, and a charge generation layer between an anode and a cathode, wherein a low unoccupied molecular orbitals (LUMO) level of the electron transport layer is higher than a LUMO level of a host included in the charge generation layer so as to adjust a charge balance of the emission layer based on a temperature change of a room temperature environment and a high temperature environment relevant to a vehicle.

The charge generation layer may include an N-type charge generation layer.

A difference between the LUMO level of the electron transport layer and the LUMO level of the host included in the N-type charge generation layer may be greater than 0.2 eV.

A difference between the LUMO level of the electron transport layer and the LUMO level of the host included in the N-type charge generation layer may be 0.4 eV or more.

The N-type charge generation layer may include a metal, the metal being at least one material among lithium (Li), sodium (Na), potassium (K), cesium (Cs), magnesium (Mg), strontium (Sr), barium (Ba), radium (Ra), Liq, and an N-type dopant.

One among the anode and the cathode may include a semitransmissive electrode.

The temperature may be 25° C. to 105° C.

The emission layer may include at least one or more emission layers, and the at least one or more emission layers may emit lights having a same color.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE ILLUSTRATED EMBODIMENTS

Figure 1:
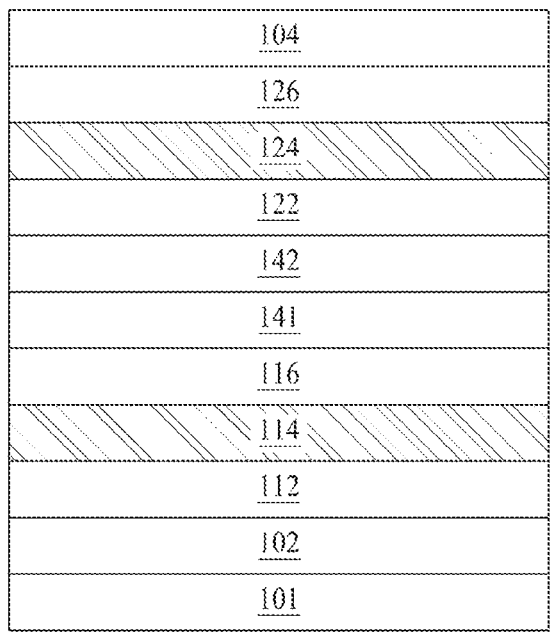
FIG. 1 is a diagram illustrating an organic light emitting device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

An organic light emitting device includes an emission layer which is formed between two electrodes. An electron and a hole are injected from the two electrodes into the emission layer, and an exciton is generated by combining the electron with the hole. The organic light emitting device is a device based on the principle that light is emitted when the generated exciton is dropped from an excited state to a ground state.

A hole transport layer or an electron transport layer may be provided for injecting the electron and the hole into the emission layer included in the organic light emitting device. Since the electron transport layer is a layer that plays an important role in adjusting a balance of the electron and the hole, the organic light emitting device may be configured in a structure where a barrier of the electron transport layer is not high in order for the electron to be smoothly injected into the emission layer. Therefore, the electron transport layer may use a material which is low in low unoccupied molecular orbitals (LUMO) level.

Moreover, when the organic light emitting device includes two emission parts, an N-type charge generation layer and a P-type charge generation layer may be provided for adjusting a charge balance between the two emission parts. The N-type charge generation layer may be provided adjacent to the electron transport layer, and the N-type charge generation layer may be provided as an organic layer on which metal is doped.

Therefore, in a case where the electron transport layer has a low LUMO level, since the electron is fast transferred to the emission layer, a driving voltage does not increase, but it is difficult to adjust a balance of the electron and the hole in the emission layer. For this reason, a recombination zone or an emission zone which is an exciton generation zone is not located in the emission layer but is located in an interface between the hole transport layer and the emission layer with time, and thus, the emission layer cannot contribute to emit light, causing a reduction in lifetime of the emission layer.

Moreover, when a barrier is not provided between the electron transport layer and the N-type charge generation layer, or the same material is applied to the electron transport layer and the N-type charge generation layer, or a LUMO level of the electron transport layer is similar to that of a host included in the N-type charge generation layer, there is a problem that metal included in the N-type charge generation layer is spread into the emission layer. Therefore, when the electron transport layer adjacent to the N-type charge generation layer cannot prevent the metal included in the N-type charge generation layer from being spread, the metal is spread into the emission layer, and for this reason, lifetime of the emission layer is reduced, and the driving voltage increases with time.

Therefore, the inventors recognize the above-described problems and have done various experiments for improving lifetime of an organic light emitting display device by adjusting a LUMO level of each of an electron transport layer and a charge generation layer which configure the organic light emitting display device.

Through the various experiments, the inventors have invented an organic light emitting display device and a lighting apparatus for vehicles using the same, in which by adjusting a LUMO level of each of an electron transport layer and a charge generation layer so as to enhance lifetime of the organic light emitting display device, metal included in the charge generation layer is prevented from being spread to an emission layer, and a balance of electrons and holes is maintained in the emission layer, thereby enhancing lifetime.

FIG. 1 is a diagram illustrating an organic light emitting device 100 according to an embodiment of the present disclosure.

The organic light emitting device 100 according to an embodiment of the present disclosure illustrated in FIG. 1 may include a substrate 101, first and second electrodes 102 and 104, and a plurality of organic layers 112, 116, 122, 126, 141 and 142 and a plurality of emission layers 114 and 124 between the first and second electrodes 102 and 104.

The substrate 101 may be formed of an insulating material or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The first electrode 102 is an anode that supplies a hole, and may be formed of indium tin oxide (ITO), indium zinc oxide (IZO), or the like which is a transparent conductive material such as transparent conductive oxide (TCO). However, the present embodiment is not limited thereto. Alternatively, the first electrode 102 may be formed of gold (Au), silver (Ag), aluminum (Al), molybdenum (Mo), magnesium (Mg), lithium (Li), calcium (Ca), lithium fluoride (LiF), Ag—Mg, Mg—LiF, ITO, IZO, and/or the like, may be formed of an alloy thereof, or may be formed of a single layer or a multilayer. However, the present embodiment is not limited thereto.

Moreover, the first electrode 102 may include a reflective layer in order for light, emitted from each of the emission layers 114 and 124, not to be irradiated in a down direction through the first electrode 102. In detail, the first electrode 102 may have a three-layer structure where a first transparent layer, a reflective layer, and a second transparent layer are sequentially stacked. The first transparent layer and the second transparent layer may each be formed of TCO such as ITO, IZO, or the like. The reflective layer between two the transparent layers may be formed of a metal material such as copper (Cu), silver (Ag), palladium (Pd), Ag alloy, or the like. For example, the first electrode 102 may be formed of ITO/Ag/ITO. Alternatively, the first electrode 102 may have a two-layer structure where a transparent layer and a reflective layer are stacked.

The second electrode 104 is a cathode that supplies an electron, and may be formed of Au, Ag, Al, Mo, Mg, Li, Ca, LiF, ITO, IZO, Ag—Mg, Mg—LiF, and/or the like, or may be formed of an alloy thereof. The second electrode 104 may be formed a single layer or a multilayer. However, the present embodiment is not limited thereto.

Each of the first electrode 102 and the second electrode 104 may be referred to as an anode or a cathode. Alternatively, the first electrode 102 may be formed as a transmissive electrode, and the second electrode 104 may be formed as a semitransmissive electrode. Alternatively, the first electrode 102 may be formed as a reflective electrode, and the second electrode 104 may be formed as a semitransmissive electrode. Alternatively, the first electrode 102 may be formed as a semitransmissive electrode, and the second electrode 104 may be formed as a transmissive electrode. Alternatively, at least one among the first and second electrodes 102 and 104 may be formed as a semitransmissive electrode.

Moreover, a capping layer may be further formed on the second electrode 104, for protecting the organic light emitting device. Also, the capping layer may be omitted depending on the structure or characteristic of the organic light emitting device.

A first layer, which includes a first hole transport layer (HTL) 112, a first emission layer (EML) 114, and a first electron transport layer (ETL) 116, may be formed on the first electrode 102.

The first HTL 112 may supply a hole, supplied from the first electrode 102, to the first EML 114. The first ETL 116 may supply an electron, supplied from the second electrode 104, to the first EML 114. Therefore, the hole supplied through the first HTL 112 and the electron supplied through the first ETL 116 may be recombined in the first EML 114 to generate an exciton. A zone where the exciton is generated in the first EML 114 may be referred to as a recombination zone or an emission zone (or an emission area).

A hole injection layer (HIL) may be further formed on the first electrode 102. The HIL enables a hole, supplied from the first electrode 102, to be smoothly transferred to the first HTL 112.

Moreover, a second layer which includes a second HTL 122, a second EML 124, and a second ETL 126 may be formed on the first layer.

The second HTL 122 may supply a hole, supplied from the first electrode 102, to the second EML 124. The second ETL 126 may supply an electron, supplied from the second electrode 104, to the second EML 124. Therefore, the hole supplied through the second HTL 122 and the electron supplied through the second ETL 126 may be recombined in the second EML 124 to generate an exciton. A zone where the exciton is generated in the second EML 124 may be referred to as a recombination zone or an emission zone (or an emission area).

Moreover, a charge generation layer (CGL) may be formed between the first layer and the second layer. The CGL may adjust a charge balance between the first EML 114 and the second EML 124 and may include an N-type CGL 141 and a P-type CGL 142.

The N-type CGL 141 may inject an electron into the first EML 114 and may be formed an organic layer doped with metal and/or the like, but is not limited thereto.

The P-type CGL 142 may inject a hole into the second EML 124 and may be formed of an organic layer including a P-type dopant, but is not limited thereto.

The first EML 114 and the second EML 124 may be emission layers that emit lights having the same color. For example, the first EML 114 and the second EML 124 may be one among a red EML, a green EML, and a blue EML. Therefore, the organic light emitting device according to an embodiment of the present disclosure may be a mono light emitting device that emits lights having the same color. Alternatively, the first EML 114 and the second EML 124 may be emission layers that emit lights having different colors, respectively. For example, the first EML 114 may be one among a red EML, a green EML, and a blue EML, and the second EML 124 may be an emission layer having a color that differs from that of the first EML 114.

Moreover, the first EML 114 and the second EML 124 may each include at least one host and at least one dopant. The at least one host may include a host having hole characteristic or a host having electron characteristic. Alternatively, the at least one host may be a mixed host including two or more kinds of hosts. When the at least one host includes two or more kinds of hosts, the at least one host may include a host having hole characteristic and a host having electron characteristic. Also, the at least one dopant may include a fluorescent dopant or a phosphorescent dopant.

When each of the first EML 114 and the second EML 124 is the red EML, a host constituting the red EML may include one or more host materials, and examples of the host materials may include 4,4'-bis(carbazol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), and Be complex, etc. A dopant constituting the red EML may include a phosphorescent dopant, and examples of the phosphorescent dopant may include bis(2-benzo[b]thiophen-2-yl-pyridine)(acetylacetonate)iridium (III)) (Ir(btp)$_2$(acac)), bis(1-phenylisoquinoline)(acetylacetonate)iridium(III) (Ir(piq)$_2$(acac)), tris(1-phenylquinoline)iridium(III) (Ir(piq)$_3$), 5,10,15,20-tetraphenyltetrabenzoporphyrin platinum complex (Pt (TPBP)), etc. Alternatively, the dopant constituting the red EML may be a fluorescent dopant, and examples of the fluorescent dopant may include perylene, etc. The materials of the host or the dopant constituting the red EML do not limit details of the present disclosure.

When each of the first EML 114 and the second EML 124 is the green EML, a host constituting the green EML may include one or more host materials, and examples of the host materials may include 4,4'-bis(carbazol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, and anthracene derivative, etc. A dopant constituting the green EML may be a phosphorescent dopant, and examples of the phosphorescent dopant may include tris(2-phenylpyridine)iridium(III) (Ir(ppy)$_3$), and Bis(2-phenylpyridine)(acetylacetonate)iridium(III) (Ir(ppy)$_2$(acac)), etc. Alternatively, the dopant constituting the green EML may be a fluorescent dopant, and examples of the fluorescent dopant may include tris(8-hydroxyquinolino) aluminum (Alq$_3$), etc. The materials of the host or the dopant constituting the green EML do not limit details of the present disclosure.

When each of the first EML 114 and the second EML 124 is the blue EML, a host constituting the blue EML may include one or more host materials, and examples of the host materials may include 4,4'-bis(carbazol-9-yl)biphenyl (CBP), 1,3-bis(carbazol-9-yl)benzene (MCP), and 9,10-di(naphth-2-yl)anthracene (ADN), etc. A dopant constituting the blue EML may be a phosphorescent dopant, and examples of the phosphorescent dopant may include (Bis [2-(4,6-difluorophenyl)pyridinato-N]picolinato)iridium(III) (FIrpic), etc. Alternatively, the dopant constituting the blue EML may be a fluorescent dopant, and examples of the fluorescent dopant may include polyfluorene (PFO)-based polymer, polyphenylenevinylene (PPV)-based polymer, and pyren derivative, etc. The materials of the host or the dopant constituting the blue EML do not limit details of the present disclosure.

Since the first ETL 116 adjacent to the N-type CGL 141 plays an important role in adjusting a balance of electrons and holes, electron mobility of the first ETL 116 should be adjusted, and the first ETL 116 should be configured that metal included in the N-type CGL 141 should be prevented from being spread to the first EML 114. Therefore, a LUMO level of the first ETL 116 and a LUMO level of a host included in the N-type CGL 141 should be optimized in order for the first ETL 116 to maintain a balance of electrons and holes and so as to prevent the metal included in the N-type CGL 141 from being spread to the first EML 114. That is, according to the present embodiment, by adjusting the LUMO level of the first ETL 116 and the LUMO level of the host included in the N-type CGL 141, the metal included in the N-type CGL 141 is prevented from being spread to the first EML 114, and an emission zone is still located in the first EML 114 despite the elapse of time, thereby providing an organic light emitting display device with enhanced lifetime and a lighting apparatus for vehicles using the same. Also, according to the present embodiment, provided is an adjusted LUMO level between ETL and N-CGL (ALEN) structure where the LUMO level of the first ETL 116 and the LUMO level of the host included in the N-type CGL 141 are adjusted to prevent the metal included in the N-type CGL 141 from being spread to the first EML 114 and in order for the emission zone to be still located in the first EML 114 despite the elapse of time. Moreover, according to the present embodiment, provided is a lighting apparatus for vehicles including an organic light emitting device where the LUMO level of the first ETL 116 is adjusted higher than the LUMO level of the host included in the N-type CGL 141 in order for a charge balance of the emission layer to be adjusted depending on a temperature change of a room temperature environment or a high temperature environment relevant to vehicles.

Moreover, an energy band diagram and an emission distribution based on the LUMO level of the first ETL 116 and the LUMO level of the host included in the N-type CGL 141 according to an embodiment of the present disclosure will be described below with reference to FIG. 2.

Figure 2A:
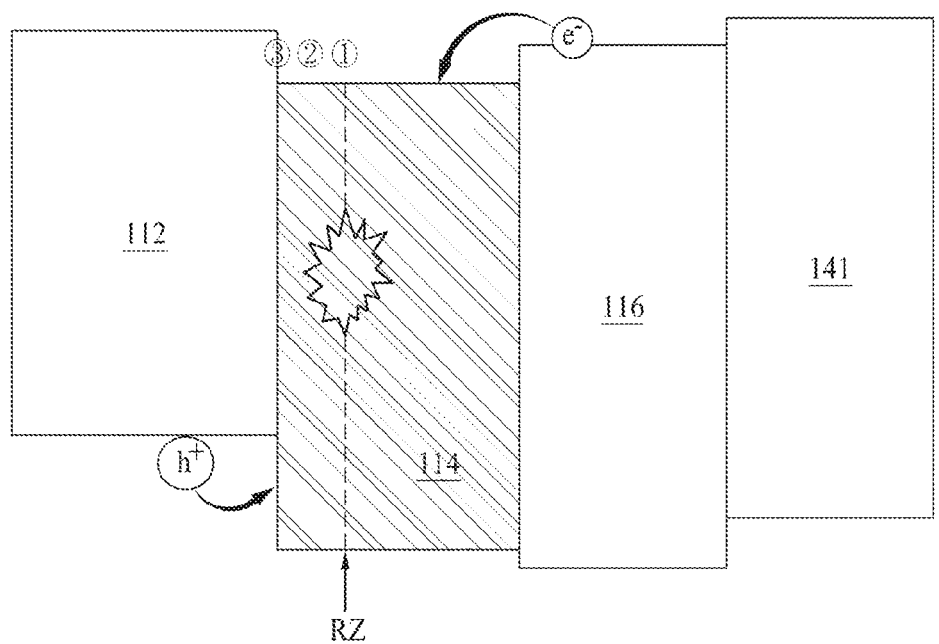
FIG. 2A is a diagram illustrating an energy band diagram according to a comparative example.

FIG. 2A is a diagram illustrating an energy band diagram according to a comparative example. The comparative example may correspond to a case where the LUMO level of the first ETL 116 is similar to the LUMO level of the host included in the N-type CGL 141.

As shown in FIG. 2A, in the first EML 114, an electron (e−) supplied through the first ETL 116 and a hole (h+) supplied through the first HTL 112 are recombined to generate an exciton. An exciton generation zone of the first EML 114 may be referred to as an emission zone (an emission area) or a recombination zone RZ. It can be seen that the recombination zone RZ is not located in a center of the first EML 114.

Figure 2B:
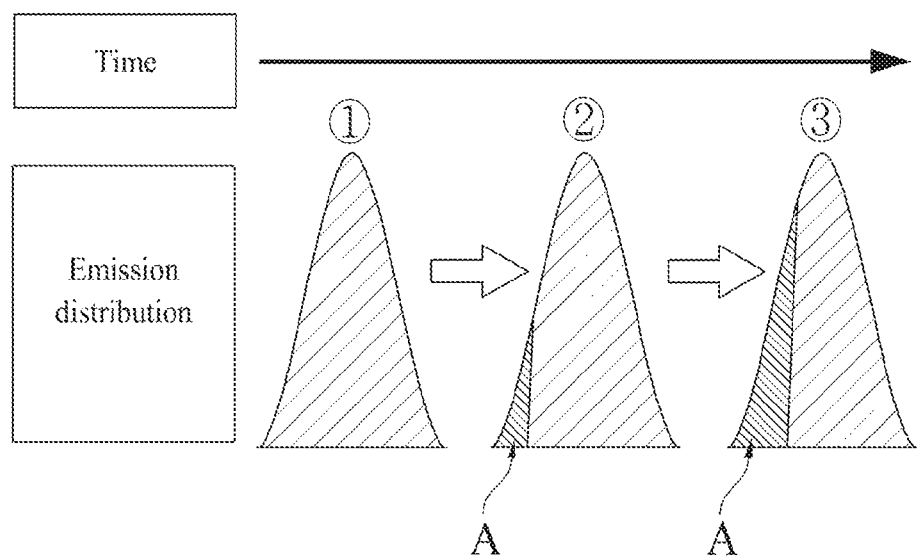
FIG. 2B is a diagram showing an emission distribution with respect to time according to a comparative example.

FIG. 2B is a diagram showing an emission distribution in an emission zone with respect to time according to a comparative example.

The emission zone of the first EML 114 moves from ⌊ to ⌑ with the elapse of time. That is, the emission zone moves from the first EML 114 to an interface between the first HTL 112 and the first EML 114. Therefore, as shown in FIG. 2B, it can be seen that as the emission zone of the first EML 114 get closer to ⌑ from ⌊ with the elapse of time, a non-emission zone A is enlarged. Since the non-emission zone A is enlarged with the elapse of time, it can be seen that the first EML 114 cannot emit light.

The first ETL 116 cannot act as a barrier that prevents the metal included in the N-type CGL 141 from being spread, and for this reason, the metal is spread to the first EML 114, causing a reduction in lifetime.

Figure 2C:
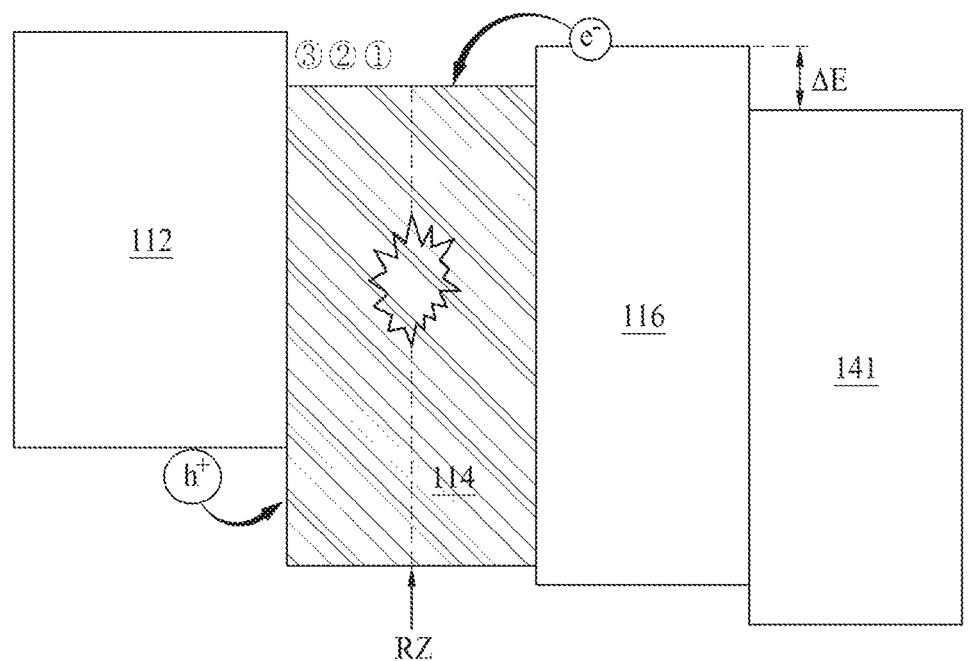
FIG. 2C is a diagram illustrating an energy band diagram according to an embodiment of the present disclosure.

FIG. 2C is a diagram illustrating an energy band diagram according to an embodiment of the present disclosure.

As shown in FIG. 2C, in the first EML 114, an electron (e−) supplied through the first ETL 116 and a hole (h+) supplied through the first HTL 112 are recombined to generate an exciton. An exciton generation zone of the first EML 114 may be referred to as an emission zone (an emission area) or a recombination zone RZ. It can be seen that the recombination zone RZ is located in a center of the first EML 114.

Moreover, a difference "ΔE" between the LUMO level of the first ETL 116 and the LUMO level of the host included in the N-type CGL 141 is largely adjusted. The difference "ΔE" between the LUMO level of the first ETL 116 and the LUMO level of the host included in the N-type CGL 141 may be greater than 0.2 eV. Alternatively, the difference "ΔE" between the LUMO level of the first ETL 116 and the LUMO level of the host included in the N-type CGL 141 may be 0.4 eV or more. Therefore, when the LUMO level of the first ETL 116 is adjusted higher than that of the host included in the N-type CGL 141, a balance of electrons and holes is achieved in the first EML 114, and thus, it can be seen that the emission zone or recombination zone RZ of the first EML 114 is disposed on the first EML 114.

Figure 2D:
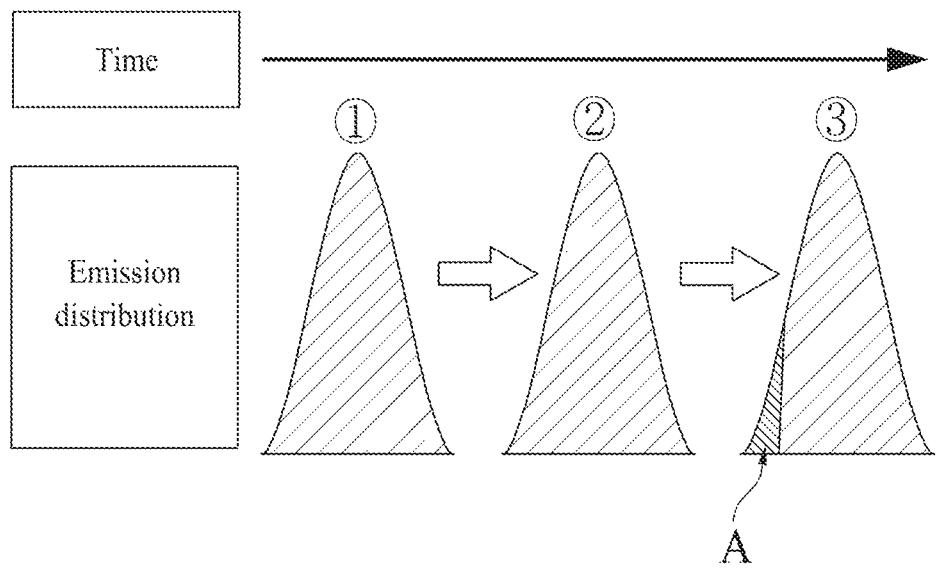
FIG. 2D is a diagram showing an emission distribution with respect to time according to an embodiment of the present disclosure.

FIG. 2D is a diagram showing an emission distribution in an emission zone with respect to time according to an embodiment of the present disclosure.

As shown in FIG. 2D, it can be seen that an emission distribution of an emission zone RZ is maintained despite the elapse of time. In FIG. 2D, it can be seen that a portion A which is a non-emission zone is provided in ⌑ after a certain time elapses from ⌊ and ⌑. In comparison with the comparative example shown in FIG. 2B, it can be seen that in an embodiment of the present disclosure, the portion A which is the non-emission zone is small with the elapse of time. Therefore, it can be seen that an emission zone of an emission layer is maintained in the emission layer despite the elapse of time. That is, when the LUMO level of the first ETL 116 is adjusted higher than that of the host included in the N-type CGL 141, it can be seen that light is emitted from the emission layer despite the emission zone of the emission layer being moved with the elapse of time.

Moreover, when the LUMO level of the first ETL 116 is adjusted higher than that of the host included in the N-type CGL 141, the first ETL 116 acts as the barrier in order for the metal included in the N-type CGL 141 not to be spread to the emission layer, thereby preventing the metal from being spread to the first EML 114. Accordingly, a balance of electrons and holes is maintained in the emission layer, the metal included in the N-type CGL 141 is not spread to the emission layer, thereby enhancing lifetime.

Figure 3:
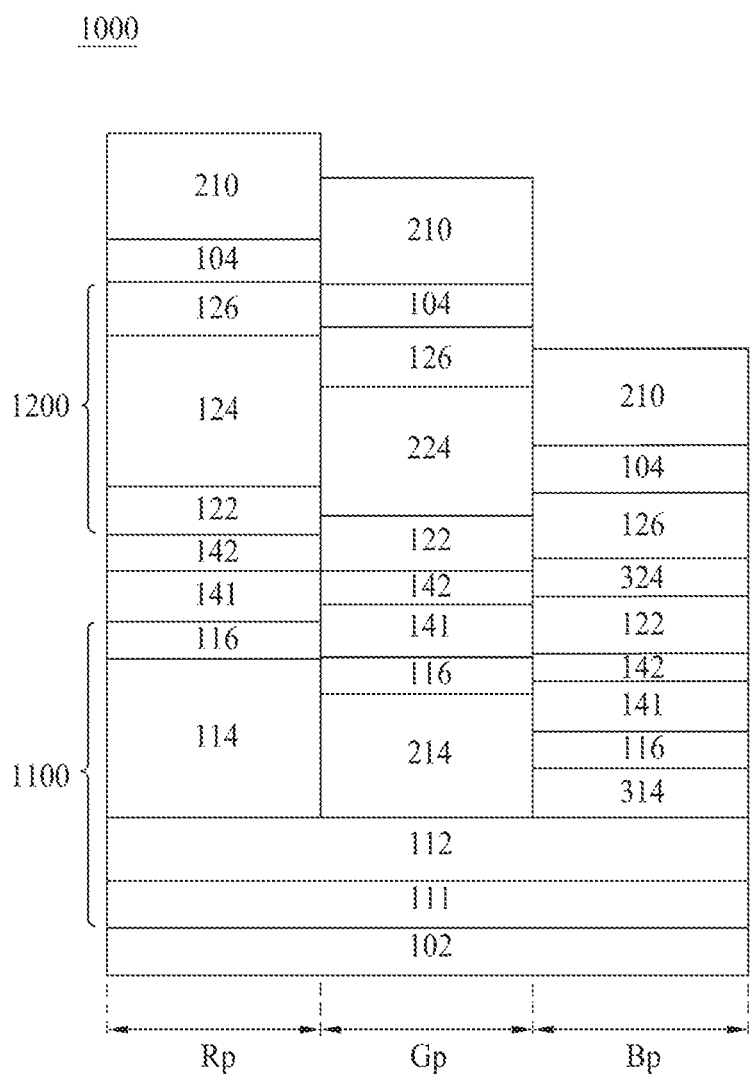
FIG. 3 is a diagram illustrating an organic light emitting device according to another embodiment of the present disclosure.

FIG. 3 is a diagram illustrating an organic light emitting device 1000 according to another embodiment of the present disclosure.

Referring to FIG. 3, the organic light emitting device 1000 according to another embodiment of the present disclosure may include a red subpixel area Rp, a green subpixel area Gp, and a blue subpixel area Bp on a substrate. Moreover, the organic light emitting device 1000 according to another embodiment of the present disclosure may be an organic light emitting device including two emission parts that include first and second emission parts 1100 and 1200 between a first electrode 102 and a second electrode 104.

The first emission part 1100, configured with a first layer which includes an HIL 111, a first HTL 112, a first red EML 114, a first green EML 214, a first blue EML 314, and a first ETL 116, may be disposed on the first electrode 102. The second emission part 1200, configured with a second layer which includes a second HTL 122, a second red EML 124, a second green EML 224, a second blue EML 324, and a second ETL 126, may be disposed on the first emission part 1100. Also, an N-type CGL 141 and a P-type CGL 142 may be provided between the first emission part 1100 and the second emission part 1200. Alternatively, the N-type CGL 141 and the P-type CGL 142 may be provided between the first layer and the second layer. Also, the second electrode 104 and a capping layer (CPL) 210 may be provided on the second emission part 1200. Also, a LUMO level of the first ETL 116 may be adjusted higher than that of a host included in the N-type CGL 141. Alternatively, the organic light emitting device 1000 may have the ALEN(Adjusted LUMO level between ETL and N-CGL) structure where the LUMO level of the first ETL 116 and the LUMO level of the host included in the N-type CGL 141 are adjusted to prevent metal included in the N-type CGL 141 from being spread to the first EML 114 and in order for an emission zone to be still located in the first EML 114 despite the elapse of time. Also, the first layer, the second layer, the N-type CGL 141, the P-type CGL 142, and the capping layer 210 may be referred to as organic layers, respectively.

In an organic light emitting display device including the organic light emitting device according to another embodiment of the present disclosure, a pixel area may be provided on the substrate by at least one among a gate line and a data line. A power line which extends in parallel with one among the gate line and the data line may be disposed on the substrate, and a switching thin film transistor (TFT) connected to the gate line or the data line and a driving TFT connected to the switching TFT may be disposed in the pixel area. The driving TFT may be connected to the first electrode 102.

The substrate may be formed of an insulating material or a material having flexibility. The substrate may be formed of glass, metal, plastic, and/or the like, but is not limited thereto. If an organic light emitting display device is a flexible organic light emitting display device, the substrate may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The first electrode 102 may be disposed on the substrate to correspond to each of the red subpixel area Rp, the green subpixel area Gp, and the blue subpixel area Bp.

For example, the first electrode 102 may be formed of gold (Au), silver (Ag), aluminum (Al), molybdenum (Mo), magnesium (Mg), lithium (Li), calcium (Ca), lithium fluoride (LiF), Ag—Mg, Mg—LiF, ITO, IZO, and/or the like, may be formed of an alloy thereof, or may be formed of a single layer or a multilayer. However, the present embodiment is not limited thereto.

Moreover, the first electrode 102 may include a reflective layer in order for light L, emitted from each of a plurality of emission layers 114, 124, 214, 224, 314 and 324, not to be irradiated in a down direction through the first electrode 102. In detail, the first electrode 102 may have a three-layer structure where a first transparent layer, a reflective layer, and a second transparent layer are sequentially stacked. The first transparent layer and the second transparent layer may each be formed of TCO such as ITO, IZO, or the like. The reflective layer between two the transparent layers may be formed of a metal material such as copper (Cu), silver (Ag), palladium (Pd), Ag alloy, or the like. For example, the first electrode 102 may be formed of ITO/Ag/ITO. Alternatively, the first electrode 102 may have a two-layer structure where a transparent layer and a reflective layer are stacked.

The HIL 111 may be disposed on the first electrode 102 to correspond to all of the red subpixel area Rp, the green subpixel area Gp, and the blue subpixel area Bp.

The HIL 111 enables a hole to be smoothly injected and may be formed of one or more materials of dipyrazine[2,3-f:2',3'-h]quinoxaline-2,3,6,7,10,11-hexacarbonitrile (HAT-CN), cupper phthalocyanine (CuPc), poly(3,4)-ethylenedioxythiophene (PEDOT), N,N'-bis(naphthalen-1-yl)-N,N'-bis(phenyl)2-2'-dimethylbenzidine (α-NPD), N,N'-bis(3-methylphenyl)-N,N'-bis(phenyl)-benzidine (TPD), N,N'-bis (naphthalene-1-yl)-N,N'-bis(phenyl)-benzidine (NPB), 4,4', 4"-tris(carbazol-9-yl)triphenylamine (TcTa), 2,2',7,7'-tetrakis(N,N-diphenylamino)-9,9-spirobifluorene (spiro-TAD), and 4,4'-bis(carbazol-9-yl)biphenyl (CBP), but is not limited thereto.

The HIL 111 may be formed by doping a first P-type dopant on a material forming the first HTL 112. In this case, the HIL 111 and the first HTL 112 may be formed through a successive process using one process equipment. The first P-type dopant may consist of 2,3,5,6-tetrafluoro-7,7,8,8-tetracyanl-quinodimethane (F4-TCNQ), but is not limited thereto.

The first HTL 112 may be disposed on the HIL 111 to correspond to all of the red subpixel area Rp, the green subpixel area Gp, and the blue subpixel area Bp. The second HTL 122 may be disposed on the P-type CGL 142 to correspond to all of the red subpixel area Rp, the green subpixel area Gp, and the blue subpixel area Bp.

The first HTL 112 and the second HTL 122 enable holes to be smoothly transported. The first HTL 112 and the second HTL 122 may each be formed of one or more of N,N'-bis(naphthalene-1-yl)-N,N'-bis(phenyl)-2,2'-dimethylbenzidine (NPD), N,N'-bis)naphthalene-1-yl)-N,N'-bis(phenyl)-benzidine (NPB), and N,N'-bis(3-methylphenyl)-N,N'-bis(phenyl)-benzidine (TPD), but is not limited thereto.

The first red EML 114 may be disposed in the red subpixel area Rp on the first HTL 112, and the second red EML 124 may be disposed in the red subpixel area Rp on the second HTL 122. The first red EML 114 and the second red EML 124 may each include a light-emitting material that emits red light, and the light-emitting material may use a fluorescent material or a phosphorescent material. Also, the first red EML 114 and the second red EML 124 may each include at least one host and at least one dopant. The at least one host may include a host having hole characteristic or a host having electron characteristic. Alternatively, the at least one host may be a mixed host including two or more kinds of hosts. When the at least one host includes two or more kinds of hosts, the at least one host may include a host having hole characteristic and a host having electron characteristic. Also, the at least one dopant may include a fluorescent dopant or a phosphorescent dopant.

In more detail, the first red EML 114 and the second red EML 124 may each include one or more host materials, and examples of the host materials may include 4,4'-bis(carbazol-9-yl)biphenyl (CBP), 1,3-bis(carbazol-9-yl)benzene (MCP), N,N'-bis(naphthalene-1-yl)-N,N'-bis(phenyl)-2,2'- dimethylbenzidine (NPD), and Be complex. A dopant constituting each of the first red EML 114 and the second red EML 124 may include a phosphorescent dopant, and examples of the phosphorescent dopant may include bis(2-benzo[b]thiophen-2-yl-pyridine)(acetylacetonate)iridium (III) (Ir(btp)$_2$(acac)), bis(1-phenylisoquinoline)(acetylacetonate)iridium(III) (Ir(piq)$_2$(acac)), tris(1-phenylquinoline) iridium(III) (Ir(piq)$_3$), 5,10,15,20-tetraphenyltetrabenzoporphyrin platinum complex (Pt (TPBP)), and/or the like. The dopant constituting each of the first red EML 114 and the second red EML 124 may be a fluorescent dopant, and examples of the fluorescent dopant may include perylene and/or the like. The materials of the host or the dopant constituting each of the first red EML 114 and the second red EML 124 do not limit details of the present disclosure.

The first green EML 214 may be disposed in the green subpixel area Gp on the first HTL 112, and the second green EML 224 may be disposed in the green subpixel area Gp on the second HTL 122. The first green EML 214 and the second green EML 224 may each include a light-emitting material that emits green light, and the light-emitting material may use a fluorescent material or a phosphorescent material. Also, the first green EML 214 and the second green EML 224 may each include at least one host and at least one dopant. The at least one host may include a host having hole characteristic or a host having electron characteristic. Alternatively, the at least one host may be a mixed host including two or more kinds of hosts. When the at least one host includes two or more kinds of hosts, the at least one host may include a host having hole characteristic and a host having electron characteristic. Also, the at least one dopant may include a fluorescent dopant or a phosphorescent dopant.

In more detail, the first green EML 214 and the second green EML 224 may each include one or more host materials, and examples of the host materials may include 4,4'-bis(carbazol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, anthracene derivative, etc. A dopant constituting each of the first green EML 214 and the second green EML 224 may include a phosphorescent dopant, and examples of the phosphorescent dopant may include tris(2-phenylpyridine) iridium(III) (Ir(ppy)$_3$), Bis(2-phenylpyridine)(acetylacetonate)iridium(III) (Ir(ppy)$_2$(acac)), etc. The dopant constituting each of the first green EML 214 and the second green EML 224 may be a fluorescent dopant, and examples of the fluorescent dopant may include tris(8-hydroxyquinolino) aluminum (Alq$_3$), etc. The materials of the host or the dopant constituting each of the first green EML 214 and the second green EML 224 do not limit details of the present disclosure.

The first blue EML 314 may be disposed in the blue subpixel area Bp on the first HTL 112, and the second blue EML 324 may be disposed in the blue subpixel area Bp on the second HTL 122. The first blue EML 314 and the second blue EML 324 may each include a light-emitting material that emits blue light, and the light-emitting material may use a fluorescent material or a phosphorescent material. Also, the first blue EML 314 and the second blue EML 324 may each include at least one host and at least one dopant. The at least one host may include a host having hole characteristic or a host having electron characteristic. Alternatively, the at least one host may be a mixed host including two or more kinds of hosts. When the at least one host includes two or more kinds of hosts, the at least one host may include a host having hole characteristic and a host having electron characteristic. Also, the at least one dopant may include a fluorescent dopant or a phosphorescent dopant.

In more detail, the first blue EML 314 and the second blue EML 324 may each include one or more host materials, and examples of the host materials may include 4,4-'bis(carbazol-9-yl)biphenyl (CBP), 1,3-bis(carbazol-9-yl)benzene (MCP), 9,10-di(naphth-2-yl)anthracene (ADN), etc. A dopant constituting each of the first blue EML 314 and the second blue EML 324 may include a phosphorescent dopant, and examples of the phosphorescent dopant may include Bis[2-(4,6-difluorophenyl)pyridinato-N]picolinato)iridium (III) (FIrpic), etc. The dopant constituting each of the first blue EML 314 and the second blue EML 324 may be a fluorescent dopant, and examples of the fluorescent dopant may include polyfluorene (PFO)-based polymer, polyphenylenevinylene (PPV)-based polymer, pyren derivative, etc. The materials of the host or the dopant constituting each of the first blue EML 314 and the second blue EML 324 do not limit details of the present disclosure.

The first ETL 116 may be disposed on the first red EML 114, the first green EML 214, and the first blue EML 314 to correspond to all of the red subpixel area Rp, the green subpixel area Gp, and the blue subpixel area Bp. The second ETL 126 may be disposed on the second red EML 124, the second green EML 224, and the second blue EML 324 to correspond to all of the red subpixel area Rp, the green subpixel area Gp, and the blue subpixel area Bp.

The first ETL 116 and the second ETL 126 enable electrons to be smoothly transported or injected. The second ETL 126 may be formed of one or more of tris(8-hydroxyquinolonato)aluminum (Alq$_3$), 3-(4-biphenyl)-4-phenyl-5-tert-butylpneyl-1,2,4-triazole (TAZ), and bis(2-methyl-8-quinolinolate)-4-(phenylphenolato)aluminum (BAlq), but is not limited thereto.

Moreover, an electron injection layer (EIL) may be further formed on the second HTL 126.

The EIL may be formed of one or more of tris(8-hydroxyquinolonato)aluminium (Alq$_3$) and lithium fluoride (LiF), but is not limited thereto.

Moreover, according to the embodiments of the present disclosure, lifetime of the first red EML 114, the first green EML 214, and the first blue EML 314 is enhanced by adjusting a LUMO level of the first ETL 116 and a LUMO level of a host included in the N-type CGL 141. The first ETL 116 may be formed of one or more of oxadiazole derivatives, benzimidazole derivatives, silole derivatives, thiophene derivatives, perfluorinated chemical, tetracene group, anthracene derivatives, triazine chemical, 8-hydroxy-quinolinolato-lithium (Liq), tris(8-hydroxy-quinolonato) aluminum (Alq$_3$), 3-(4-biphenyl)-4-phenyl-5-tert-butylpneyl-1,2,4-triazole (TAZ), and bis(2-methyl-8-quinolinolate)-4-(phenylphenolato)aluminum (BAlq), but is not limited thereto. Also, the first ETL 116 may be a mixed ETL which is formed by co-depositing one or more of the above-described materials. In a case where the first ETL 116 is formed by co-depositing one or more materials, a LUMO level of at least one among the one or more materials of the first ETL 116 may be 0.2 eV greater than a LUMO level of a host included in the N-type CGL 141. Alternatively, in a case where the first ETL 116 is formed by co-depositing one or more materials, a LUMO level of at least one among the one or more materials of the first ETL 116 may be equal to or 0.4 eV greater than the LUMO level of the host included in the N-type CGL 141.

Moreover, oxadiazole derivatives may be, for example, spiro-2-biphenyl-4-yl-5-(4-tert-butylphenyl)-1,3,4-oxadiazole (spiro-PBD). Spiro-PBD may be represented by the following Formula 1.

[Formula 1]

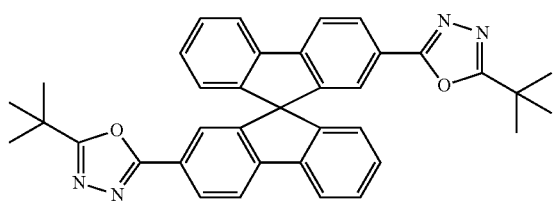

Benzimidazole derivatives may be, for example, tris(1-phenyl)-1H-benzimidazole (TPBI). TPBI may be represented by the following Formula 2.

[Formula 2]

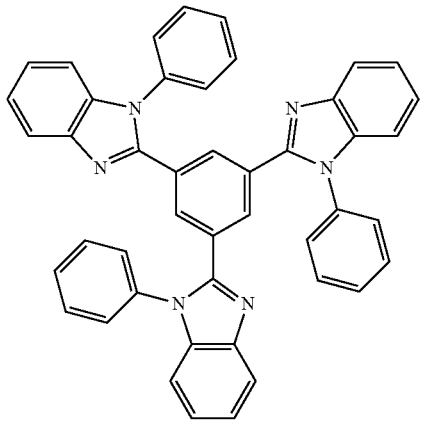

[Formula 3]

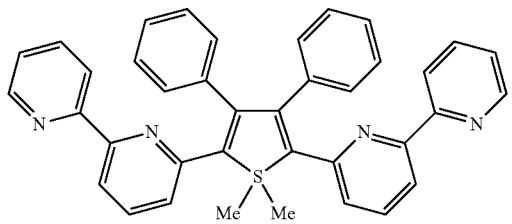

Thiophene derivatives may be, for example, 5,5'-bis(dimethylboryl)-2,2':5',2''-terthiophene (BMB-3T). BMB-3T may be represented by the following Formula 4.

[Formula 4]

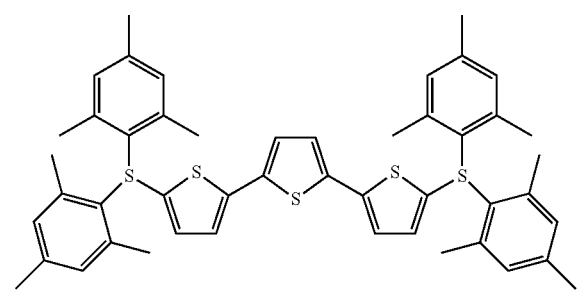

Perfluorinated chemical may be, for example, perfluoro-2-naphthyl-substituted (PF-6P). PF-6P may be represented by the following Formula 5.

[Formula 5]

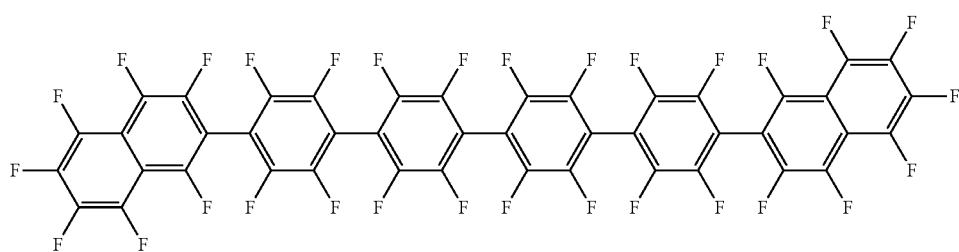

Silole derivatives may be, for example, 2,5-bis(6'-(2'',2''''-bipyridyl))-1,1-dimethyl-3,4-diphenylsilole (PyPySPyPy). PyPySPyPy may be represented by the following Formula 3.

Tetracene group may be, for example, cyclooctatetracene (COT). COT may be represented by the following Formula 6.

[Formula 6]

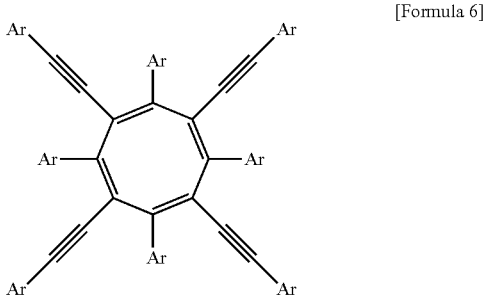

Moreover, a thickness of each of the first ETL 116 and the second ETL 126 may be adjusted based on electron-transporting characteristic. A thickness of the first ETL 116 may be 5 nm or more in order for the first ETL 116 to act as a barrier that prevents metal included in the N-type CGL 141 from being spread, and may be adjusted to 30 nm or less, based on a charge balance and electron-transporting characteristic. Therefore, a thickness of the first ETL 116 may be 5 nm to 30 nm.

Here, a structure according to an embodiment of the present disclosure is not limited, and at least one among the HIL 111, the first HTL 112, the second HTL 122, the second ETL 126, and the EIL may be omitted. Also, at least one among the HIL 111, the first HTL 112, the second HTL 122, the second ETL 126, and the EIL may be formed of two or more layers.

The N-type CGL 141 may be disposed on the first ETL 116 to correspond to all of the red subpixel area Rp, the green subpixel area Gp, and the blue subpixel area Bp. The P-type CGL 142 may be disposed on the N-type CGL 141 to correspond to all of the red subpixel area Rp, the green subpixel area Gp, and the blue subpixel area Bp. The N-type CGL 141 and the P-type CGL 142 may be formed in an NP junction structure.

The N-type CGL 141 and the P-type CGL 142 may be disposed between the first emission part 1100 and the second emission part 1200. The N-type CGL 141 and the P-type CGL 142 may adjust a charge balance between the first emission part 1100 and the second emission part 1200.

The N-type CGL 141 may help inject an electron into the first emission part 1100 which is disposed under the N-type CGL 141. The P-type CGL 142 may help inject a hole into the second emission part 1200 which is disposed on the P-type CGL 142.

In more detail, the N-type CGL 141 which injects an electron may be formed of alkali metal, an alkali metal compound, an organic material which injects an electron, or a compound thereof. Also, lifetime of an emission layer is enhanced by adjusting the LUMO level of the host included in the N-type CGL 141 and the LUMO level of the first ETL 116. A host of the N-type CGL 141 may consist of at least one among tris(8-hydroxyquinolino)aluminum (Alq$_3$) and 9,10-di(naphth-2-yl)anthracene (ADN). The N-type CGL 141 may be formed by doping at least one among alkali metal such as lithium (Li), sodium (Na), potassium (K), or cesium (Cs), alkali earth metal such as magnesium (Mg), strontium (Sr), barium (Ba), or radium (Ra), Liq, and an N-type dopant on the host.

The P-type CGL 142 may be disposed on the N-type CGL 141. A host material of the P-type CGL 142 which injects a hole may consist of the same material as a material of each of the HIL 111, the first HTL 112, and the second HTL 122 and may include a second P-type dopant consisting of a P-type material. For example, the host material of the P-type CGL 142 may consist of one or more of dipyrazine[2,3-f: 2',3'-h]quinoxaline-2,3,6,7,10,11 -hexacarbonitrile (HAT-CN), cupper phthalocyanine (CuPc), poly(3,4)-ethylenedi-oxythiophene (PEDOT), N,N'-bis(naphthalen-1-yl)-N,N'-bis(phenyl)2-2'-dimethylbenzidine (α-NPD), N,N'-bis(3-methylphenyl)-N,N'-bis(phenyl)-benzidine (TPD), N,N'-bis(naphthalene-1-yl)-N,N'-bis(phenyl)-benzidine (NPB), 4,4',4"-tris(carbazol-9-yl)triphenylamine (TcTa), 2,2',7,7'-tetrakis(N,N-diphenylamino)-9,9-spirobifluorene (spiro-TAD), and 4,4'-bis(carbazol-9-yl)biphenyl (CBP), but is not limited thereto. The P-type CGL 142 may be formed by doping the second P-type dopant on the material, but is not limited thereto. Also, the P-type CGL 142 may be referred to as a P-type HIL which is an HIL doped with a P-type dopant.

The second electrode 104 may be disposed on the second ETL 126 to correspond to all of the red subpixel area Rp, the green subpixel area Gp, and the blue subpixel area Bp.

The second electrode 104 is a cathode that supplies an electron, and may be formed of Au, Ag, Al, Mo, Mg, Li, Ca, LiF, ITO, IZO, Mg—Ag, Mg—LiF, and/or the like, or may be formed of an alloy thereof. The second electrode 104 may be formed a single layer or a multilayer. However, the present embodiment is not limited thereto.

Moreover, when the second electrode 104 is formed of Mg—Ag, the second electrode 104 may have semitransmissive characteristic. That is, light emitted from an organic emission layer may be transferred to the outside through the second electrode 104, but since the second electrode 104 has semitransmissive characteristic, some of the light may again travel to the first electrode 102. Therefore, due to a microcavity effect where repetitive reflection is performed between the first and second electrodes 102 and 104 which act as reflective layers, light may be repeatedly reflected in a cavity between the first electrode 102 and the second electrode 104, thereby increasing light efficiency.

Alternatively, the first electrode 102 may be formed as a transmissive electrode, and the second electrode 104 may be formed as a reflective electrode. Therefore, the light emitted from the organic emission layer may be transferred to the outside through the first electrode 102.

Each of the first electrode 102 and the second electrode 104 may be referred to as an anode or a cathode. Alternatively, the first electrode 102 may be formed as a transmissive electrode, and the second electrode 104 may be formed as a semitransmissive electrode. Alternatively, the first electrode 102 may be formed as a reflective electrode, and the second electrode 104 may be formed as a semitransmissive electrode. Alternatively, the first electrode 102 may be formed as a semitransmissive electrode, and the second electrode 104 may be formed as a transmissive electrode. Alternatively, at least one among the first and second electrodes 102 and 104 may be formed as a semitransmissive electrode. Alternatively, at least one among the first electrode 102 which is an anode and second electrodes 104 which is a cathode may be formed as a transmissive electrode.

A capping layer 210 may be disposed on the second electrode 104. The capping layer 210 is for increasing a light extraction effect of the organic light emitting device, The capping layer 210 may be formed of one among the first HTL 112, the second HTL 122, the first ETL 116, the second ETL 126, host material of the first red EML 114, host material of the second red EML 124, host material of the first green EML 214, host material of the second green EML 224, host material of the first blue EML 314, and host material of the second blue EML 324. Also, the capping layer 210 may be omitted. Also, in FIG. 3, the organic layers are illustrated as having different thicknesses. However, this is for distinguishing the organic layers for convenience, and details of the present disclosure are not limited thereto.

Figure 4:
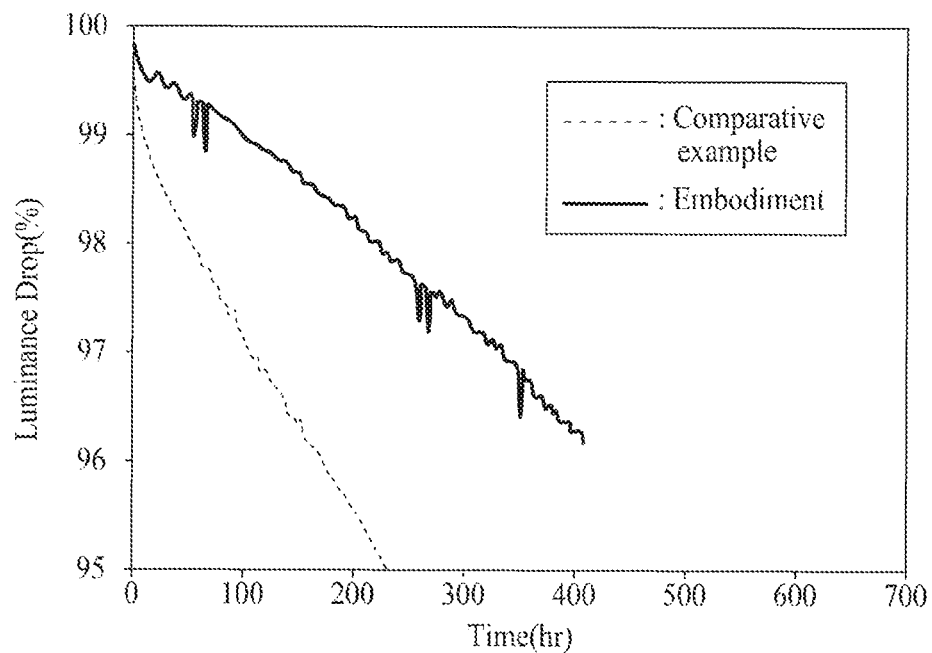
FIG. 4 is a diagram showing lifetime characteristic according to a comparative example and another embodiment of the present disclosure.

FIG. 4 is a diagram showing lifetime characteristic of blue according to a comparative example and another embodiment of the present disclosure. In FIG. 4, the abscissa axis indicates a time (hr), and the ordinate axis indicates a luminance drop rate (%).

The comparative example and embodiment of FIG. 4 may correspond to a case where the organic light emitting device of FIG. 3 is applied. In FIG. 4, the comparative example may correspond to a case of applying an ETL where a difference between a LUMO level of an ETL and a LUMO level of a host included in an N-type CGL is small adjusted. Also, the embodiment may correspond to a case of applying an ETL where the difference between the LUMO level of the ETL and the LUMO level of the host included in the N-type CGL is largely adjusted. As shown in FIG. 4, it can be seen that lifetime characteristic is further enhanced in the embodiment than the comparative example with respect to a time (i.e., 95% lifetime (T95) of an organic light emitting device) taken until emission luminance corresponding to 95% of initial emission luminance is obtained. That is, it can be seen that lifetime characteristic of blue of the embodiment is enhanced two times more than that of the comparative example. Accordingly, since the difference between the LUMO level of the ETL and the LUMO level of the host included in the N-type CGL is largely adjusted, a balance of electrons and holes is achieved in an emission layer, and thus, it can be seen that lifetime of the organic light emitting device is enhanced.

Moreover, lifetime characteristic based on the difference between the LUMO level of the ETL and the LUMO level of the host included in the N-type CGL has been measured. This will be described below with reference to the following Table 1 and FIGS. 5 to 9.

The following Table 1 shows a result which is obtained by measuring the driving voltage, efficiency, color coordinates, and lifetime of comparative examples and embodiments.

TABLE 1

| Division | Driving Voltage (V) | Efficiency (cd/A) | CIE_x | CIE_y | Lifetime (T95) |
|---|---|---|---|---|---|
| Comparative Example 1 | 7.0 | 10.1 | 0.135 | 0.068 | 10% |
| Comparative Example 2 | 7.9 | 10.8 | 0.135 | 0.068 | 95% |
| Embodiment 1 | 7.3 | 10.8 | 0.135 | 0.068 | 100% |
| Embodiment 2 | 7.3 | 11.3 | 0.135 | 0.068 | 145% |
| Embodiment 3 | 7.6 | 9.7 | 0.135 | 0.068 | 166% |

In Table 1, in comparative examples 1 and 2 and embodiments 1 to 3, experiments have been done by using the organic light emitting device of FIG. 3.

In the comparative example 1, a first electrode is formed on a substrate, a first HTL is formed of N,N'-bis(naphthalene-1-yl)-N,N'-bis(phenyl)-2,2'-dimethylbenzidine (NPD), and an HIL may be formed by doping 2,3,5,6-tetrofluoro-7,7,8,8-tetracyano-quinodimethane (F4-TCNQ) on a zone adjacent to the substrate. Also, a blue subpixel area Bp is formed by doping pyren derivatives as dopants on anthracene derivatives which are blue hosts. A green subpixel area Gp is formed by doping Bis(2-phenylpyridine)(acetylacetonate)iridium(III) (Ir(ppy)$_2$(acac)) as a dopant on 4,4'-bis(carbazol-9-yl)biphenyl (CBP) and anthracene derivatives which are green hosts. A red subpixel area Rp is formed by doping bis(2-benzo[b]thiophen-2-yl-pyridine)(acetylacetonate)iridium(III) (Ir(btp)$_2$(acac)) as a dopant on Be complex which is a red host. Also, a first ETL is formed of a material among materials having a LUMO level of −3.23 eV to have a thickness of 15 nm. For example, the first ETL may be formed of one among tris(8-hydroxy-quinolonato)aluminum (Alq$_3$), 3-(4-biphenyl)-4-phenyl-5-tert-butylpneyl-1,2,4-triazole (TAZ), and bis(2-methyl-8-quinolinolate)-4-(phenylphenolato)aluminum (BAlq). An N-type CGL is formed by doping Li, which is metal, on anthracene derivatives to have a thickness of 15 nm. A LUMO level of a host included in the N-type CGL is −3.20 eV. Therefore, a difference between a LUMO level of the first ETL and the LUMO level of the host included in the N-type CGL is −0.03 eV. Also, a second HTL is formed of NPD, and a P-type CGL is formed by doping F4-TCNQ on NPD in an interface between the second HTL and the N-type CGL. Also, the blue subpixel area Bp is formed by doping pyren derivatives as dopants on anthracene derivatives which are blue hosts. The green subpixel area Gp is formed by doping Bis(2-phenylpyridine)(acetylacetonate)iridium(III) (Ir(ppy)$_2$(acac)) as a dopant on 4,4'-bis(carbazol-9-yl)biphenyl (CBP) and anthracene derivatives which are green hosts. The red subpixel area Rp is formed by doping bis(2-benzo[b]thiophen-2-yl-pyridine)(acetylacetonate)iridium(III) (Ir(btp)$_2$(acac)) as a dopant on Be complex which is a red host. Also, a second ETL may be formed of Alq$_3$ and Liq, and then a second electrode is formed on the second ETL. Also, a capping layer is formed of NPD. The above-described materials or thicknesses of the organic layers do not limit details of the present disclosure.

The comparative example 2 is configured identically to the comparative example 1 and uses a material where a LUMO level of a first ETL is higher than that of a host included in an N-type CGL. The LUMO level of the first ETL is −3.00 eV, and a LUMO level of the host included in the N-type CGL may be −3.20 eV. Therefore, a difference between the LUMO level of the first ETL and the LUMO level of the host included in the N-type CGL is 0.2 eV. Also, the first ETL is formed to have a thickness of 15 nm, and the N-type CGL is formed to have a thickness of 15 nm. The above-described materials or thicknesses of the organic layers do not limit details of the present disclosure.

The embodiment 1 is configured identically to the comparative example 1 and uses a material where a LUMO level of a first ETL is higher than that of a host included in an N-type CGL. The LUMO level of the first ETL is −2.80 eV, and a LUMO level of the host included in the N-type CGL is −3.20 eV. Therefore, a difference between the LUMO level of the first ETL and the LUMO level of the host included in the N-type CGL is 0.4 eV. The first ETL may be formed of a material among materials having a LUMO level of −2.80 eV. For example, the first ETL may be formed of one or more of oxadiazole derivatives, benzimidazole derivatives, silole derivatives, thiophene derivatives, perfluorinated chemical, tetracene group, anthracene derivatives, triazine chemical, 8-hydroxyquinolinolato-lithium (Liq), tris(8-hydroxy-quinolonato)aluminum (Al q$_3$), 3-(4-biphenyl)-4-phenyl-5-tert-butylpneyl-1,2,4-triazole (TAZ), and bis(2-methyl-8-quinolinolate)-4-(phenylphenolato)aluminum (BAlq). Also, the first ETL is formed to have a thickness of 15 nm, and the N-type CGL is formed to have a thickness of 15 nm. The above-described materials or thicknesses of the organic layers do not limit details of the present disclosure.

The embodiment 2 is configured identically to the comparative example 1 and uses a material where a LUMO level of a first ETL is higher than that of a host included in an N-type CGL. The LUMO level of the first ETL is −2.57 eV, and a LUMO level of the host included in the N-type CGL is −3.20 eV. Therefore, a difference between the LUMO level of the first ETL and the LUMO level of the host included in the N-type CGL is 0.63 eV. The first ETL is formed of a material among materials having a LUMO level of −2.57 eV. For example, the first ETL may be formed of one or more of oxadiazole derivatives, benzimidazole derivatives, silole derivatives, thiophene derivatives, perfluorinated chemical, tetracene group, anthracene derivatives, triazine chemical, 8-hydroxyquinolinolato-lithium (Liq), tris(8-hydroxy-quinolonato)aluminum ($Alq_3$), 3-(4-biphenyl)-4-phenyl-5-tert-butylpneyl-1,2,4-triazole (TAZ), and bis(2-methyl-8-quinolinolate)-4-(phenylphenolato)aluminum (BAlq). Also, the first ETL is formed to have a thickness of 15 nm, and the N-type CGL is formed to have a thickness of 15 nm. The above-described materials or thicknesses of the organic layers do not limit details of the present disclosure.

The embodiment 3 is configured identically to the comparative example 1 and uses a material where a LUMO level of a first ETL is higher than that of a host included in an N-type CGL. The LUMO level of the first ETL is −2.20 eV, and a LUMO level of the host included in the N-type CGL is −3.20 eV. Therefore, a difference between the LUMO level of the first ETL and the LUMO level of the host included in the N-type CGL is 1.0 eV. The first ETL is formed of a material among materials having a LUMO level of −2.20 eV. For example, the first ETL may be formed of one or more of oxadiazole derivatives, benzimidazole derivatives, silole derivatives, thiophene derivatives, perfluorinated chemical, tetracene group, anthracene derivatives, triazine chemical, 8-hydroxyquinolinolato-lithium (Liq), tris(8-hydroxy-quinolonato)aluminum ($Alq_3$), 3-(4-biphenyl)-4-phenyl-5-tert-butylpneyl-1,2,4-triazole (TAZ), and bis(2-methyl-8-quinolinolate)-4-(phenylphenolato)aluminum (BAlq). Also, the first ETL is formed to have a thickness of 15 nm, and the N-type CGL is formed to have a thickness of 15 nm. The above-described materials or thicknesses of the organic layers do not limit details of the present disclosure.

In Table 1, color coordinates (CIEx, CIEy) represent blue color coordinates. Table 1 shows a result that is obtained by comparing the driving voltages (V), the efficiencies (cd/A), and the lifetimes in a state where the blue color coordinates are identically set.

To describe the driving voltage (V), as shown in Table 1, in comparison with the comparative example 2, since the comparative example 1 corresponds to a case where a difference between the LUMO level of the first ETL and the LUMO level of the host included in the N-type CGL is small, it can be seen that in the comparative example 1, the driving voltage does not increase. Also, in the embodiments 1 to 3, since the difference between the LUMO level of the first ETL and the LUMO level of the host included in the N-type CGL is greater than 0.2 eV, it can be seen that the driving voltage does not increase in comparison with the comparative example 2. Through this, in the embodiments 1 to 3 corresponding to a case where the difference between the LUMO level of the first ETL and the LUMO level of the host included in the N-type CGL is greater than 0.2 eV, it can be seen that the driving voltage does not increase in comparison with the comparative example 2.

To describe the efficiency, in the embodiments 1 and 2 corresponding to a case where the difference between the LUMO level of the first ETL and the LUMO level of the host included in the N-type CGL is large, it can be seen that the efficiency increases in comparison with the comparative example 1. Through this, in the comparative example 1, it can be seen that since a barrier of the first ETL is not high, an electron is smoothly injected into the emission layer and thus the driving voltage does not increase, but electron mobility becomes relatively higher than hole mobility and thus a charge balance is broken, causing a degradation in efficiency. Also, it can be seen that the efficiencies of the embodiments 1 to 3, corresponding to a case where the difference between the LUMO level of the first ETL and the LUMO level of the host included in the N-type CGL is greater than 0.2 eV, are almost similar to or are further enhanced than that of the comparative example 2.

To describe the lifetime, the lifetimes of the comparative examples 1 and 2 and the embodiments 2 and 3 have been compared in a state where the lifetime of the embodiment 1 is set to 100%. The lifetime (T95) has been measured based on a time (i.e., 95% lifetime (T95) of an organic light emitting device) taken until emission luminance corresponding to 95% of initial emission luminance is obtained. It can be seen that the embodiments 2 and 3, corresponding to a case where the difference between the LUMO level of the first ETL and the LUMO level of the host included in the N-type CGL is greater than 0.4 eV, are enhanced 45% to 66% more in lifetime than the embodiment 1. Therefore, the difference between the LUMO level of the first ETL and the LUMO level of the host included in the N-type CGL may be adjusted greater than 0.2 eV, and thus, it can be seen that the driving voltage is relatively reduced, the efficiency is enhanced, or the lifetime is enhanced.

A result, obtained by measuring the lifetime characteristics of the comparative examples 1 and 2 and the embodiments 1 to 3, will be described below with reference to FIGS. 5 to 7.

Figure 5:
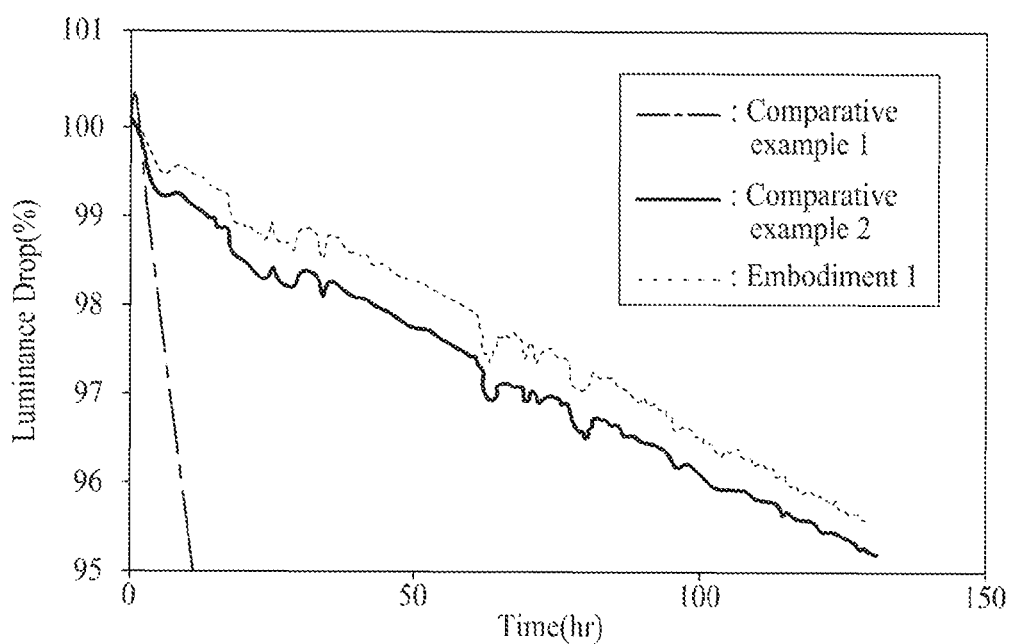
FIG. 5 is a diagram showing lifetime characteristic according to a comparative example 1, a comparative example 2, and an embodiment 1 of the present disclosure.

FIG. 5 is a diagram showing lifetime characteristic according to the comparative example 1, the comparative example 2, and the embodiment 1 of the present disclosure.

In FIG. 5, the abscissa axis indicates a time (hr), and the ordinate axis indicates a luminance (%), the curve indicates a luminance drop rate.

As shown in FIG. 5, it can be seen that the lifetime is further enhanced in the embodiment 1 than the comparative examples 1 and 2 with respect to a time (i.e., 95% lifetime (T95) of an organic light emitting device) taken until emission luminance corresponding to 95% of initial emission luminance is obtained. Therefore, it can be seen that the lifetime of the comparative example 1, corresponding to a case where the difference between the LUMO level of the first ETL and the LUMO level of the host included in the N-type CGL is small, is about 10% of the lifetime of the embodiment 1. Also, it can be seen that the lifetime of the comparative example 2, corresponding to a case where the difference between the LUMO level of the first ETL and the LUMO level of the host included in the N-type CGL is 0.2 eV, is about 95% of the lifetime of the embodiment 1.

Figure 6:
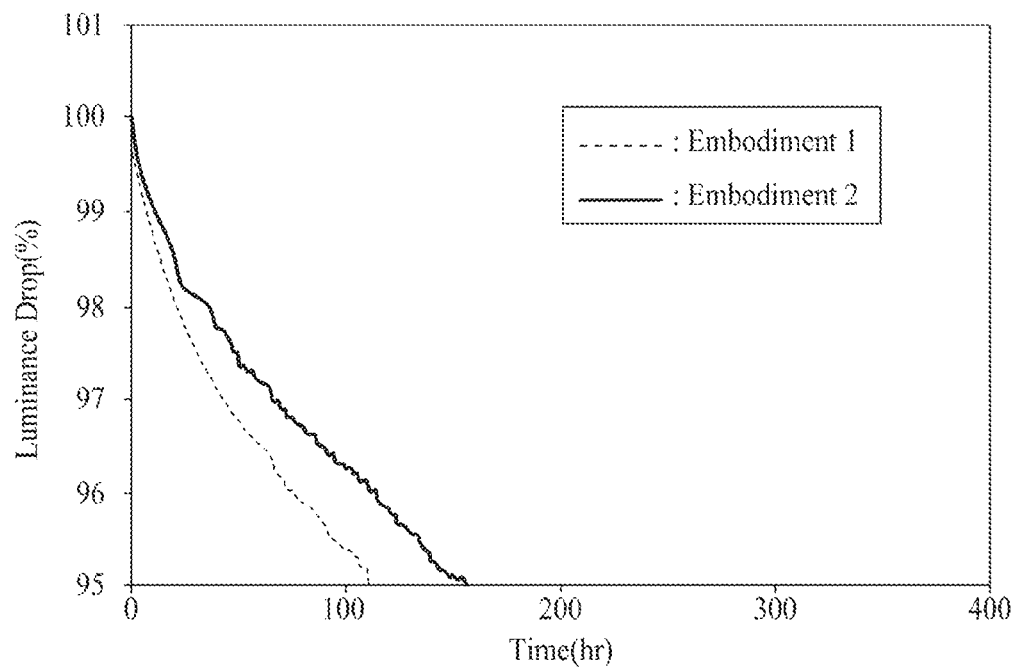
FIG. 6 is a diagram showing lifetime characteristic according to an embodiment 1 and an embodiment 2 of the present disclosure.

FIG. 6 is a diagram showing lifetime characteristic according to the embodiment 1 and embodiment 2 of the present disclosure.

In FIG. 6, the abscissa axis indicates a time (hr), and the ordinate axis indicates a luminance (%),the curve indicates a luminance drop rate.

As shown in FIG. 6, it can be seen that the lifetime is further enhanced in the embodiment 2 than the embodiment 1 with respect to a time (i.e., 95% lifetime (T95) of an organic light emitting device) taken until emission luminance corresponding to 95% of initial emission luminance is obtained. Therefore, it can be seen that the lifetime of the embodiment 2, corresponding to a case where the difference between the LUMO level of the first ETL and the LUMO level of the host included in the N-type CGL is 0.63 eV, is about 145% of the lifetime of the embodiment 1.

Figure 7:
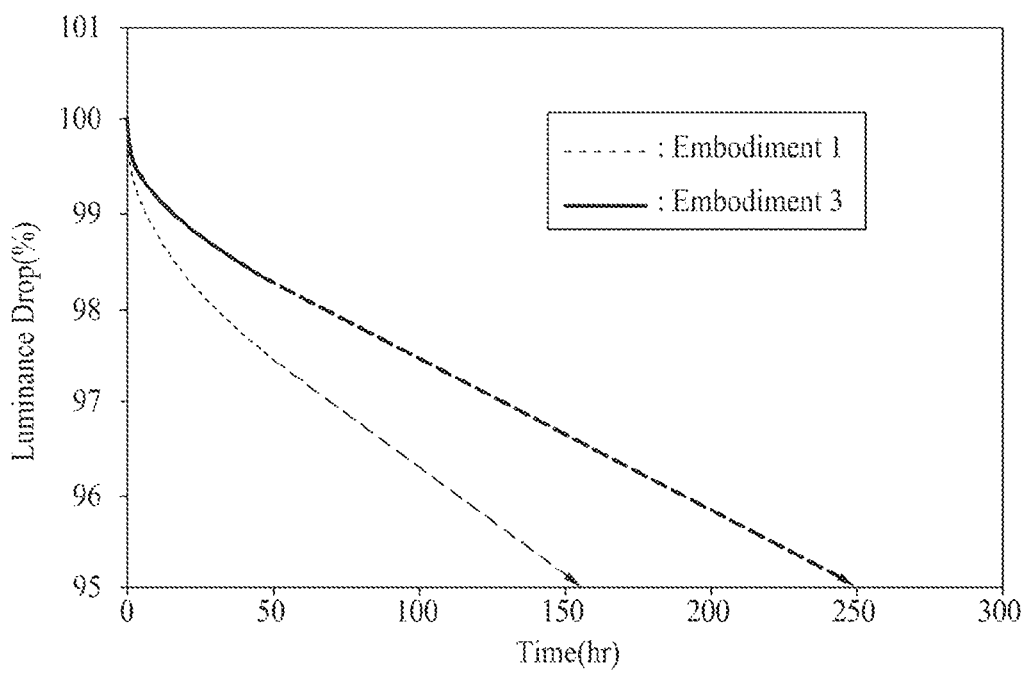
FIG. 7 is a diagram showing lifetime characteristic according to an embodiment 1 and an embodiment 3 of the present disclosure.

FIG. 7 is a diagram showing lifetime characteristic according to the embodiment 1 and embodiment 3 of the present disclosure.

In FIG. 7, the abscissa axis indicates a time (hr), and the ordinate axis indicates a luminance (%), the curve indicates a luminance drop rate.

As shown in FIG. 7, it can be seen that the lifetime is further enhanced in the embodiment 3 than the embodiment 1 with respect to a time (i.e., 95% lifetime (T95) of an organic light emitting device) taken until emission luminance corresponding to 95% of initial emission luminance is obtained. Therefore, it can be seen that the lifetime of the embodiment 3, corresponding to a case where the difference between the LUMO level of the first ETL and the LUMO level of the host included in the N-type CGL is 1.0 eV, is about 166% of the lifetime of the embodiment 1.

Therefore, it can be seen that the lifetime is enhanced in a case where the difference between the LUMO level of the first ETL and the LUMO level of the host included in the N-type CGL is greater than 0.2 eV. Also, it can be seen that the lifetime is enhanced in a case where the difference between the LUMO level of the first ETL and the LUMO level of the host included in the N-type CGL is 0.4 eV or more.

Moreover, the LUMO level of the first ETL and the LUMO level of the host included in the N-type CGL is further affected by a high temperature. Therefore, according to the embodiments of the present disclosure, by adjusting the LUMO level of the first ETL and the LUMO level of the host included in the N-type CGL, the first ETL adjusts electron mobility in a high-temperature environment and prevents metal included in the N-type CGL from being spread, thereby maintaining enhanced lifetime at a high temperature. Accordingly, provided is an organic light emitting display device or a lighting apparatus for vehicles, which maintains enhanced lifetime characteristic at the high temperature. Lifetime characteristic corresponding to a high temperature will be described below with reference to FIGS. 8 and 9.

Figure 8:
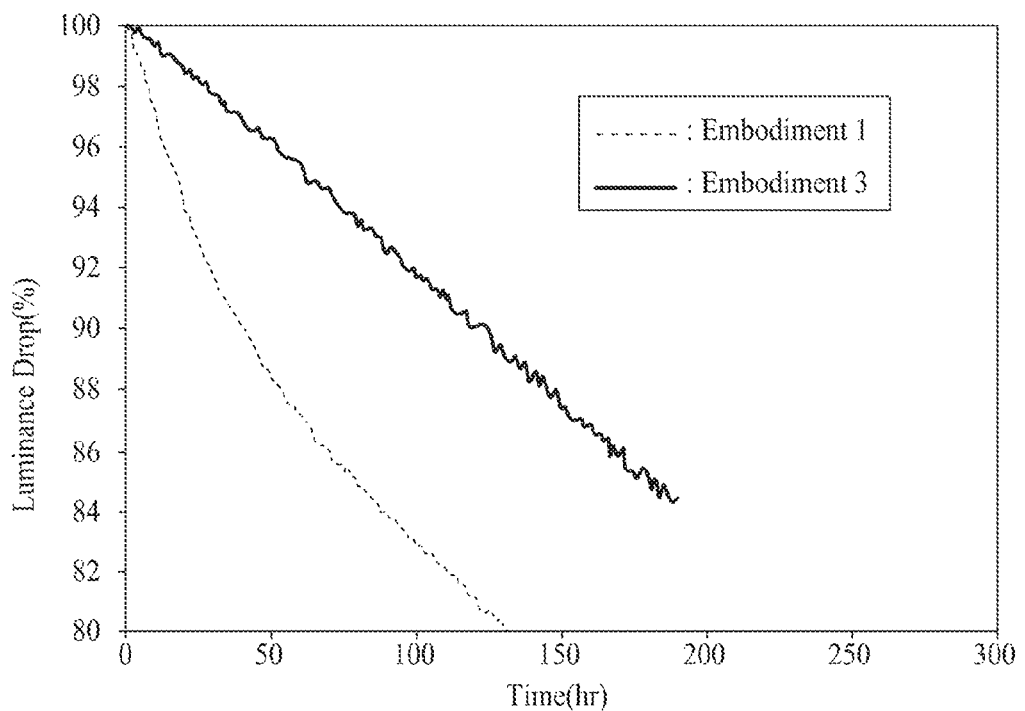
FIG. 8 is a diagram showing lifetime characteristic of a blue emission layer at a high temperature according to an embodiment 1 and an embodiment 3 of the present disclosure.

FIG. 8 is a diagram showing lifetime characteristic of a blue EML at a high temperature according to the embodiment 1 and embodiment 3 of the present disclosure.

In FIG. 8, the abscissa axis indicates a time (hr), and the ordinate axis indicates a luminance (%), the curve indicates a luminance drop rate. FIG. 8 shows a result that is obtained by measuring lifetime characteristic at 85° C. corresponding to a high temperature.

A temperature range desired by the organic light emitting display device may be a range of 25° C. to 105° C. The temperature range may be referred to as a temperature range which is used under a certain environment condition of a user using the organic light emitting display device, and may be changed depending on an environment condition of the user. Also, when the temperature range is applied to a lighting apparatus for vehicles, the temperature range may be a range of −40° C. to 105° C. depending on a temperature change of an external environment. A lifetime characteristic result of the present disclosure has been obtained by measuring lifetime characteristic at 85° C. due to a limitation of equipment, but lifetime characteristic corresponding to 105° C. may be similar to lifetime characteristic corresponding to 85° C. Accordingly, the present disclosure provides an organic light emitting display device or a lighting apparatus for vehicles, which maintains enhanced lifetime even at a high temperature of 105° C.

As shown in FIG. 8, it can be seen that lifetime characteristic is further enhanced in the embodiment 3 than the embodiment 1 with respect to a time (i.e., 80% lifetime (T80) of an organic light emitting device) taken until emission luminance corresponding to 80% of initial emission luminance is obtained. Also, in a case of measuring 95% lifetime (T95) of the organic light emitting device as in FIGS. 5 to 7, lifetime is rapidly reduced at a high temperature, and thus, in order to check a lifetime characteristic result, FIG. 8 shows a result which is obtained by measuring lifetime characteristic up to 80% lifetime (T80) of the organic light emitting device instead of lifetime (T95) for comparison of normal lifetime.

Therefore, it can be seen that lifetime of the blue EML is enhanced by 2.5 times or more in the embodiment 3, corresponding to a case where the difference between the LUMO level of the first ETL and the LUMO level of the host included in the N-type CGL is 1.0 eV, in comparison with the embodiment 1 when driving is performed at a high temperature. That is, since the difference between the LUMO level of the first ETL and the LUMO level of the host included in the N-type CGL is adjusted greater than 0.2 eV, a charge balance of the emission layer may be adjusted depending on a temperature change of a room temperature and high temperature environment, and thus, it can be seen that lifetime is enhanced. Alternatively, since the difference between the LUMO level of the first ETL and the LUMO level of the host included in the N-type CGL is adjusted to 0.4 eV or more, the charge balance of the emission layer may be adjusted depending on the temperature change of the room temperature and high temperature environment, and thus, it can be seen that lifetime is enhanced.

Figure 9:
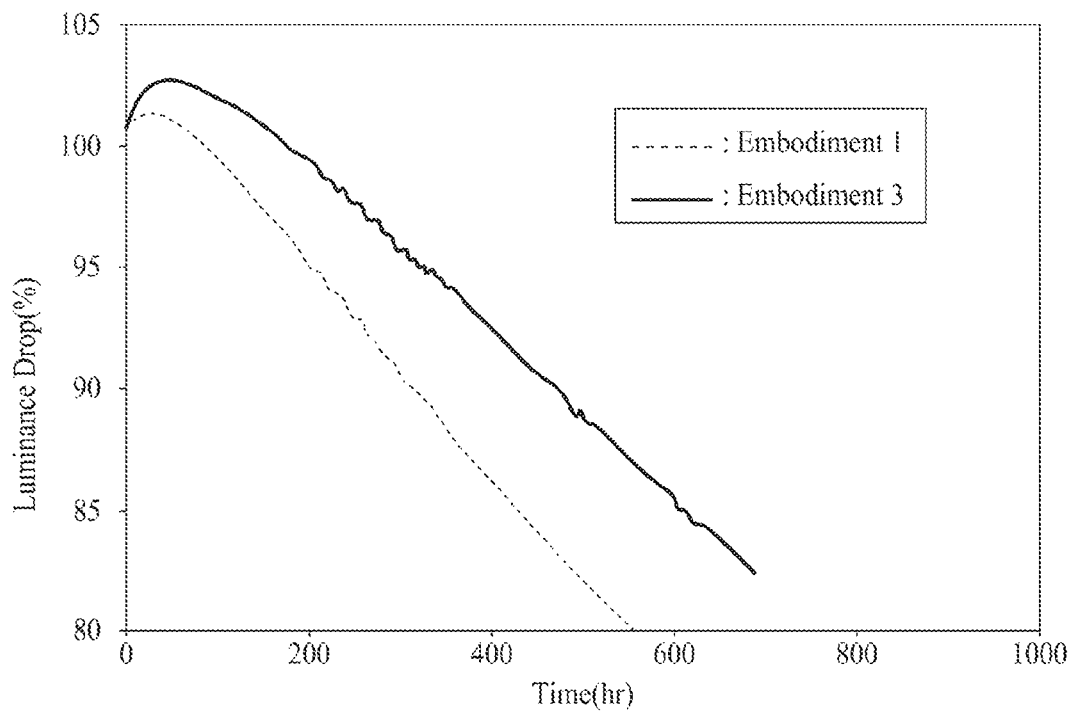
FIG. 9 is a diagram showing lifetime characteristic of a green emission layer at a high temperature according to an embodiment 1 and an embodiment 3 of the present disclosure.

FIG. 9 is a diagram showing lifetime characteristic of a green EML layer at a high temperature according to the embodiment 1 and embodiment 3 of the present disclosure.

In FIG. 9, the abscissa axis indicates a time (hr), and the ordinate axis indicates a luminance (%) the curve indicates a luminance drop rate. FIG. 9 shows a result that is obtained by measuring lifetime characteristic at 85° C. corresponding to a high temperature.

As shown in FIG. 9, it can be seen that lifetime of the green EML is enhanced by 1.6 times or more in the embodiment 3, corresponding to a case where the difference between the LUMO level of the first ETL and the LUMO level of the host included in the N-type CGL is 1.0 eV, in comparison with the embodiment 1 when driving is performed at a high temperature. That is, since the difference between the LUMO level of the first ETL and the LUMO level of the host included in the N-type CGL is adjusted greater than 0.2 eV, a charge balance of the emission layer may be adjusted depending on a temperature change of a room temperature and high temperature environment, and thus, it can be seen that lifetime is enhanced. Alternatively, since the difference between the LUMO level of the first ETL and the LUMO level of the host included in the N-type CGL is adjusted to 0.4 eV or more, the charge balance of the emission layer may be adjusted depending on the temperature change of the room temperature and high temperature environment, and thus, it can be seen that lifetime is enhanced.

Therefore, it can be seen that a temperature range corresponding to the room temperature or the high temperature may be a temperature range of 25° C. to 105° C., and lifetime of the organic light emitting display device or the lighting apparatus for vehicles according to an embodiment of the present disclosure is enhanced within a temperature range of 25° C. to 105° C. Also, since lifetime at the high temperature is enhanced, it can be seen that the high temperature stability of the organic light emitting display device or the lighting apparatus for vehicles is enhanced.

As described above, according to the embodiments of the present disclosure, the LUMO level of the ETL may be adjusted higher than the LUMO level of the host included in the CGL, and thus, the ETL may act as the barrier that prevents metal included in the CGL from being spread to the emission layer and adjust a balance of an electron and a hole in the emission layer, thereby providing an organic light emitting display device with enhanced lifetime.

Moreover, according to the embodiments of the present disclosure, since the LUMO level of the ETL is adjusted higher than the LUMO level of the host included in the CGL, the emission zone of the emission layer may be still located in the emission layer despite the elapse of time, thereby providing an organic light emitting display device in which lifetime is substantially not reduced despite the elapse of time.

Moreover, according to the embodiments of the present disclosure, the organic light emitting device may have the ALEN(Adjusted LUMO level between ETL and N-CGL) structure where the LUMO level of the ETL and the LUMO level of the host included in the N-type CGL are adjusted to prevent metal included in the N-type CGL from being spread to the emission layer and in order for the emission zone of the emission layer to be still located in the emission layer despite the elapse of time, thereby providing an organic light emitting display device with enhanced lifetime.

Moreover, according to the embodiments of the present disclosure, since the LUMO level of the ETL is adjusted higher than the LUMO level of the host included in the CGL, enhanced lifetime is maintained at the high temperature, thereby providing an organic light emitting display device in which stability is secured at the high temperature.

Figure 10:
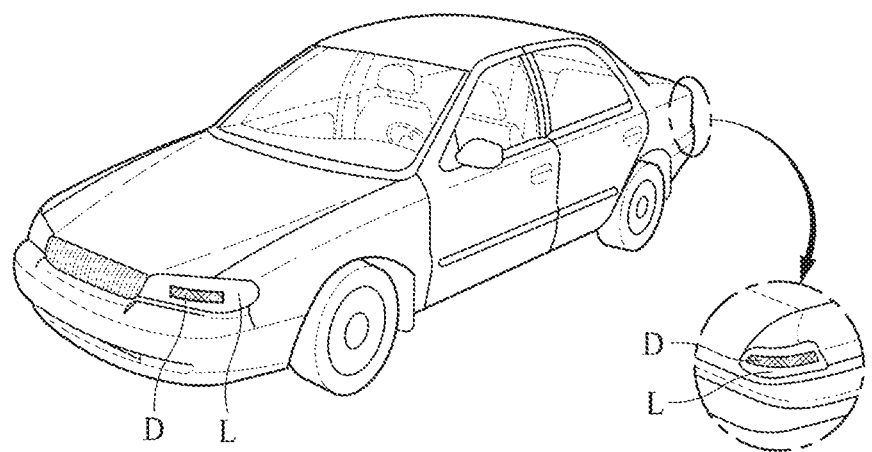
FIG. 10 is a diagram illustrating a lighting apparatus for vehicles according to an embodiment of the present disclosure.

FIG. 10 is a diagram illustrating a lighting apparatus for vehicles according to an embodiment of the present disclosure.

The vehicle lighting apparatus L of FIG. 10 may be mounted on a front surface or a rear surface of a vehicle and may secure a front view or a rear view of a driver when the vehicle is driving. The vehicle lighting apparatus L according to another embodiment of the present disclosure may be at least one among headlights, a high beam, taillights, a brake light, a back-up light, a fog lamp, a turn signal light, and an auxiliary lamp, but is not limited thereto. Alternatively, the vehicle lighting apparatus L may be applied to all indicator lamps which are used to secure a field of view of a driver and transmit or receive a signal of a vehicle. The drawing of FIG. 10 does not limit vehicle lighting applied to the vehicle lighting apparatus L according to the present embodiment.

The vehicle lighting apparatus L according to the present embodiment may include an organic light emitting device D, may surface-emit light, and may have a flexible structure. The organic light emitting device D included in the vehicle lighting apparatus L may have the structure described above with reference to FIGS. 1 to 9. The organic light emitting device D may include an emission layer, an ETL, and a CGL which are disposed between an anode and a cathode. The CGL may include an N-type CGL. Also, the N-type CGL may include metal, and the metal may be at least one among lithium (Li), sodium (Na), potassium (K), cesium (Cs), magnesium (Mg), strontium (Sr), barium (Ba), radium (Ra), Liq, and an N-type dopant. The emission layer may be provided as one or more, and the one or more emission layers may include emission layers that respectively emit lights having the same color.

Moreover, in the organic light emitting device D, the LUMO level of the ETL may be adjusted higher than the LUMO level of the host included in the N-type CGL, and thus, a charge balance of the emission layer may be adjusted depending on a change in a temperature when a vehicle drives at a room temperature or a high temperature. Accordingly, provided is a lighting apparatus for vehicles, which maintains enhanced lifetime when a vehicle drives at the room temperature or the high temperature.

Alternatively, in the organic light emitting device D, the difference between the LUMO level of the ETL and the LUMO level of the host included in the N-type CGL may be adjusted greater than 0.2 eV, and thus, a charge balance of the emission layer may be adjusted depending on a change in a temperature when a vehicle drives at a room temperature or a high temperature. Accordingly, provided is a lighting apparatus for vehicles, which maintains enhanced lifetime when a vehicle drives at the room temperature or the high temperature.

Alternatively, in the organic light emitting device D, the difference between the LUMO level of the ETL and the LUMO level of the host included in the N-type CGL may be adjusted to 0.4 eV or more, and thus, a charge balance of the emission layer may be adjusted depending on a change in a temperature when a vehicle drives at a room temperature or a high temperature. Accordingly, provided is a lighting apparatus for vehicles, which maintains enhanced lifetime when a vehicle drives at the room temperature or the high temperature.

Moreover, according to the embodiments of the present disclosure, since the LUMO level of the ETL is adjusted higher than the LUMO level of the host included in the CGL, a charge balance of the emission layer may be adjusted depending on a temperature change of a room temperature environment or a high temperature environment relevant to vehicles, thereby providing a lighting apparatus for vehicles, which is driven at the room temperature or a high temperature.

Moreover, according to the embodiments of the present disclosure, since the LUMO level of the ETL is adjusted higher than the LUMO level of the host included in the CGL, enhanced lifetime is maintained at the high temperature, thereby providing a lighting apparatus for vehicles, in which stability is secured at the high temperature.

Moreover, according to the embodiments of the present disclosure, the LUMO level of the ETL may be adjusted higher than the LUMO level of the host included in the CGL, and thus, the ETL may act as the barrier that prevents metal included in the CGL from being spread to the emission layer and adjust a balance of an electron and a hole of the emission layer, thereby providing a lighting apparatus for vehicles with enhanced lifetime.

Moreover, according to the embodiments of the present disclosure, since the LUMO level of the ETL is adjusted higher than the LUMO level of the host included in the CGL, the emission zone of the emission layer may be still located in the emission layer despite the elapse of time, thereby providing a lighting apparatus for vehicles, in which lifetime is substantially not reduced despite the elapse of time.

Moreover, according to the embodiments of the present disclosure, the organic light emitting device may have the ALEN(Adjusted LUMO level between ETL and N-CGL) structure where the LUMO level of the ETL and the LUMO level of the host included in the N-type CGL are adjusted to prevent metal included in the N-type CGL from being spread to the emission layer and in order for the emission zone of the emission layer to be still located in the emission layer despite the elapse of time, thereby providing a lighting apparatus for vehicles with enhanced lifetime.

As described above, according to the embodiments of the present disclosure, a charge balance of an electron and a hole in the emission layer may be adjusted by adjusting the LUMO level of the ETL and the LUMO level of the host included in the CGL, thereby providing an organic light emitting display device with enhanced lifetime or a lighting apparatus for vehicles using the same.

Moreover, according to the embodiments of the present disclosure, the LUMO level of the ETL may be adjusted higher than the LUMO level of the host included in the CGL, and thus, the ETL may act as a barrier that prevents metal included in the CGL from being spread to the emission layer, thereby providing an organic light emitting display device with enhanced lifetime or a lighting apparatus for vehicles using the same.

Moreover, according to the embodiments of the present disclosure, since the LUMO level of the ETL is adjusted higher than the LUMO level of the host included in the CGL, the emission zone of the emission layer may be still located in the emission layer despite the elapse of time, thereby providing an organic light emitting display device or a lighting apparatus for vehicles using the same, in which lifetime is substantially not reduced despite the elapse of time.

Moreover, according to the embodiments of the present disclosure, the organic light emitting device may have the ALEN (Adjusted LUMO level between ETL and N-CGL) structure where the LUMO level of the ETL and the LUMO level of the host included in the N-type CGL are adjusted to prevent metal included in the N-type CGL from being spread to the emission layer and in order for the emission zone of the emission layer to be still located in the emission layer despite the elapse of time, thereby providing an organic light emitting display device with enhanced lifetime or a lighting apparatus for vehicles using the same.

Moreover, according to the embodiments of the present disclosure, since the LUMO level of the ETL is adjusted higher than the LUMO level of the host included in the CGL, a charge balance of the emission layer may be adjusted depending on a temperature change of a room temperature environment or a high temperature environment relevant to vehicles, thereby providing a lighting apparatus for vehicles, which is driven at the room temperature or a high temperature.

Moreover, according to the embodiments of the present disclosure, since the LUMO level of the ETL is adjusted higher than the LUMO level of the host included in the CGL, enhanced lifetime is maintained at the high temperature, thereby providing an organic light emitting display device or a lighting apparatus for vehicles, in which stability is secured at the high temperature.

The details of the present disclosure described in technical problem, technical solution, and advantageous effects do not specify essential features of claims, and thus, the scope of claims is not limited by the details described in detailed description of the disclosure.

It will be apparent to those skilled in the art that various modifications and variations can be made in the present invention without departing from the spirit or scope of the disclosure. Thus, it is intended that the present disclosure covers the modifications and variations of this disclosure provided they come within the scope of the appended claims and their equivalents.

What is claimed is:

1. An organic light emitting display device, comprising:
    a first layer on a first electrode, the first layer including a first emission layer and a first electron transport layer;
    a second layer on the first layer, the second layer including a second emission layer and a second electron transport layer;
    a second electrode on the second layer; and
    an N-type charge generation layer between the first layer and the second layer,
    wherein a low unoccupied molecular orbitals (LUMO) level of the first electron transport layer is higher than a LUMO level of a host included in the N-type charge generation layer.

2. The organic light emitting display device of claim 1, wherein a difference between the LUMO level of the first electron transport layer and the LUMO level of the host included in the N-type charge generation layer is greater than 0.2 eV.

3. The organic light emitting display device of claim 1, wherein a difference between the LUMO level of the first electron transport layer and the LUMO level of the host included in the N-type charge generation layer is 0.4 eV or more.

4. The organic light emitting display device of claim 1, wherein
    a thickness of the first electron transport layer is 5 nm to 30 nm, and
    the first electron transport layer comprises one material or the first electron transport layer is formed by co-depositing at least two materials.

5. The organic light emitting display device of claim 1, wherein the N-type charge generation layer comprises at least one material among lithium (Li), sodium (Na), potassium (K), cesium (Cs), magnesium (Mg), strontium (Sr), barium (Ba), radium (Ra), Liq, and an N-type dopant, the host doped with the at least one material.

6. The organic light emitting display device of claim 1, wherein one among the first electrode and the second electrode comprises a semitransmissive electrode.

7. The organic light emitting display device of claim 1, wherein the first emission layer and the second emission layer emit lights having a same color.

8. An organic light emitting display device, comprising:
    a first layer on a first electrode, the first layer including a first emission layer and a first electron transport layer;
    a second layer on the first layer, the second layer including a second emission layer and a second electron transport layer;
    a second electrode on the second layer; and
    an N-type charge generation layer between the first layer and the second layer, the N-type charge generation layer including a metal,
    wherein the organic light emitting display device has an ALEN (adjusted low unoccupied molecular orbitals (LUMO) level between the electron transport layer (ETL) and the N-type charge generation layer (N-type CGL) structure where a LUMO level of the first electron transport layer and a LUMO level of a host in the N-type charge generation layer are adjusted to prevent the metal in the N-type charge generation layer from being diffused to the first emission layer and maintain an emission zone in the first emission layer despite the elapse of time.

9. The organic light emitting display device of claim 8, wherein a difference between the LUMO level of the first electron transport layer and the LUMO level of the host included in the N-type charge generation layer is greater than 0.2 eV.

10. The organic light emitting display device of claim 8, wherein a difference between the LUMO level of the first electron transport layer and the LUMO level of the host included in the N-type charge generation layer is 0.4 eV or more.

11. The organic light emitting display device of claim 8, wherein the metal included in the N-type charge generation layer is at least one material among lithium (Li), sodium (Na), potassium (K), cesium (Cs), magnesium (Mg), strontium (Sr), barium (Ba), radium (Ra), Liq, and an N-type dopant.

12. A lighting apparatus for vehicles, comprising:
an organic light emitting device including an emission layer, an electron transport layer, and a charge generation layer between an anode and a cathode,
wherein a low unoccupied molecular orbitals (LUMO) level of the electron transport layer is higher than a LUMO level of a host included in the charge generation layer so as to adjust a charge balance of the emission layer based on a temperature change of a room temperature environment and a high temperature environment relevant to a vehicle.

13. The lighting apparatus of claim 12, wherein the charge generation layer comprises an N-type charge generation layer.

14. The lighting apparatus of claim 13, wherein a difference between the LUMO level of the electron transport layer and the LUMO level of the host included in the N-type charge generation layer is greater than 0.2 eV.

15. The lighting apparatus of claim 13, wherein a difference between the LUMO level of the electron transport layer and the LUMO level of the host included in the N-type charge generation layer is 0.4 eV or more.

16. The lighting apparatus of claim 13, wherein the N-type charge generation layer comprises a metal, the metal being at least one material among lithium (Li), sodium (Na), potassium (K), cesium (Cs), magnesium (Mg), strontium (Sr), barium (Ba), radium (Ra), Liq, and an N-type dopant.

17. The lighting apparatus of claim 12, wherein one among the anode and the cathode comprises a semitransmissive electrode.

18. The lighting apparatus of claim 12, wherein the temperature is 25° C. to 105° C.

19. The lighting apparatus of claim 12, wherein the emission layer includes at least one or more emission layers, and the at least one or more emission layers emit lights having a same color.

* * * * *